US012407242B2

(12) United States Patent
Ishikawa

(10) Patent No.: US 12,407,242 B2
(45) Date of Patent: Sep. 2, 2025

(54) ISOLATED GATE DRIVER, TRACTION INVERTER, AND ELECTRIC VEHICLE

(71) Applicant: ROHM CO., LTD., Kyoto (JP)

(72) Inventor: Toshiyuki Ishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 204 days.

(21) Appl. No.: 18/454,277

(22) Filed: Aug. 23, 2023

(65) Prior Publication Data
US 2023/0421050 A1    Dec. 28, 2023

Related U.S. Application Data

(63) Continuation of application No. PCT/JP2022/002153, filed on Jan. 21, 2022.

(30) Foreign Application Priority Data

Mar. 16, 2021    (JP) .................................. 2021-042136

(51) Int. Cl.
| H02M 1/088 | (2006.01) |
| H02M 7/5387 | (2007.01) |
| H02M 1/32 | (2007.01) |
| H02M 7/00 | (2006.01) |

(52) U.S. Cl.
CPC ....... *H02M 1/088* (2013.01); *H02M 7/53871* (2013.01); *H02M 1/325* (2021.05); *H02M 7/003* (2013.01)

(58) Field of Classification Search
CPC .. H02M 1/088; H02M 7/53871; H02M 1/325; H02M 7/003
See application file for complete search history.

(56) References Cited

U.S. PATENT DOCUMENTS

| 12,278,482 B2 * | 4/2025 | Ishikawa ................. H04L 1/203 |
| 2012/0212251 A1 | 8/2012 | Yanagishima et al. |
| 2015/0137843 A1 | 5/2015 | Yanagishima et al. |
| 2017/0194959 A1 | 7/2017 | Yanagishima et al. |
| 2019/0334522 A1 | 10/2019 | Yanagishima et al. |
| 2021/0351772 A1 | 11/2021 | Yanagishima et al. |
| 2023/0068011 A1 * | 3/2023 | Matsubara ........... G11C 7/1039 |
| 2024/0356546 A1 * | 10/2024 | Gwynne ................ H03K 3/012 |

FOREIGN PATENT DOCUMENTS

WO    WO 2011/055611    5/2011

OTHER PUBLICATIONS

International Search Report and Written Opinion in International Appln. No. PCT/JP2022/002153, mailed on Apr. 5, 2022, 13 pages (with Machine Translation).

* cited by examiner

*Primary Examiner* — Adolf D Berhane
(74) *Attorney, Agent, or Firm* — Fish & Richardson P.C.

(57) ABSTRACT

An isolated gate driver has: a switch connection terminal configured to have a switching element externally connected to it; a non-volatile memory having adjustment data written to it; a register configured to store the adjustment data read from the non-volatile memory; a gate driving circuit configured to drive the gate of the switching element with a characteristic set based on a value stored in the register; and a control logic circuit configured to keep the gate driving circuit in a disabled state until completion of reading the adjustment data from the non-volatile memory and storing it in the register.

12 Claims, 23 Drawing Sheets

FIG.16

| NON-VOLATILE MEMORY | GATE DRIVER | FLT1 | FLT2 |
|---|---|---|---|
| NORMAL | NORMAL OPERATION | HiZ (H) | HiZ (H) |
| 1-BIT ERROR | NORMAL OPERATION | HiZ (H) | L |
| 2-BIT ERROR | FORCED STOP | L | L |

FIG.17

| NON-VOLATILE MEMORY | GATE DRIVER | FLT1 | FLT2 |
|---|---|---|---|
| NORMAL | NORMAL OPERATION | HiZ (H) | HiZ (H) |
| 1-BIT ERROR | NORMAL OPERATION | HiZ (H) | L |
| 2-BIT ERROR | FORCED STOP | L | HiZ (H) |

FIG.18

| NON-VOLATILE MEMORY | UVLO,OVP,SCP,OTP | GATE DRIVER | FLT1 | FLT2 |
|---|---|---|---|---|
| NORMAL | NOT DETECTED | NORMAL OPERATION | HiZ (H) | HiZ (H) |
| NORMAL | DETECTED | FORCED STOP | L | HiZ (H) |
| 1-BIT ERROR | NOT DETECTED | NORMAL OPERATION | HiZ (H) | L |
| 1-BIT ERROR | DETECTED | FORCED STOP | L | L |
| 2-BIT ERROR | — | FORCED STOP | L | L |

FIG.19

| NON-VOLATILE MEMORY | UVLO,OVP,SCP,OTP | GATE DRIVER | FLT1 | FLT2 |
|---|---|---|---|---|
| NORMAL | NOT DETECTED | NORMAL OPERATION | HiZ (H) | HiZ (H) |
| NORMAL | DETECTED | FORCED STOP | L | HiZ (H) |
| 1-BIT ERROR | NOT DETECTED | NORMAL OPERATION | HiZ (H) | L |
| 1-BIT ERROR | DETECTED | FORCED STOP | L | L |
| 2-BIT ERROR | — | FORCED STOP | L | HiZ (H) |

ISOLATED GATE DRIVER, TRACTION INVERTER, AND ELECTRIC VEHICLE

CROSS-REFERENCE TO RELATED APPLICATIONS

This nonprovisional application is a continuation application of International Patent Application No. PCT/JP2022/002153 filed on Jan. 21, 2022, which claims priority Japanese Patent Application No. 2021-042136 filed on Mar. 16, 2021, the entire contents of which are hereby incorporated by reference.

TECHNICAL FIELD

The invention disclosed herein relates to isolated gate drivers, and also relates to traction inverters and electric vehicles that employ isolated gate drivers.

BACKGROUND ART

Isolated gate drivers are used in a variety of sets (e.g., traction inverters for electric vehicles).

One example of known technology related to what is mentioned above is found in Patent Document 1 identified below.

CITATION LIST

Patent Literature

Patent Document 1: WO 2011/055611

BRIEF DESCRIPTION OF DRAWINGS

FIG. 16 is a diagram showing a first operation example of fault output.

FIG. 17 is a diagram showing a second operation example of fault output.

FIG. 18 is a diagram showing a third operation example of fault output.

FIG. 19 is a diagram showing a fourth operation example of fault output.

DESCRIPTION OF EMBODIMENTS

Signal Transmission Device (Basic Configuration)

Figure 1:
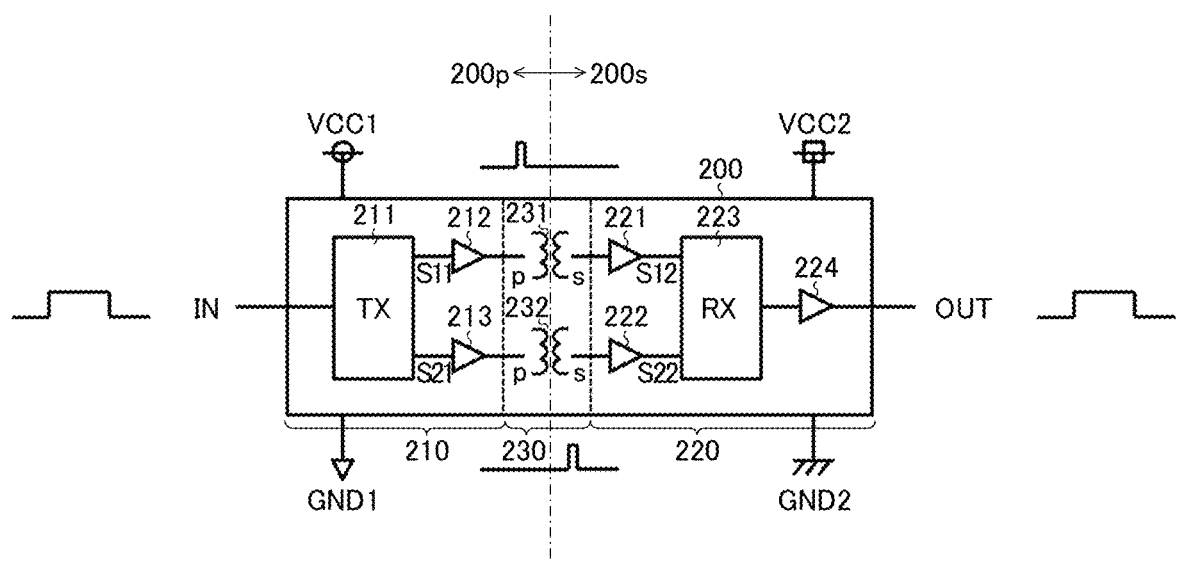
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200$p$ (VCC1-GND1 system) and a secondary circuit system 200$s$ (VCC2-GND2 system), transmits a pulse signal from the primary circuit system 200$p$ to the secondary circuit system 200$s$ to drive the gate of a switching device (unillustrated) provided in the secondary circuit system 200$s$. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231p, the reception pulse signal S12 from the secondary coil 231s. Likewise, the transformer 232 outputs, according to the transmission pulse signal S21 fed to the primary coil 232p, the reception pulse signal S22 from the secondary coil 232s.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200p to the secondary circuit system 200s.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

Transformer Chip (Basic Structure)

Figure 2:
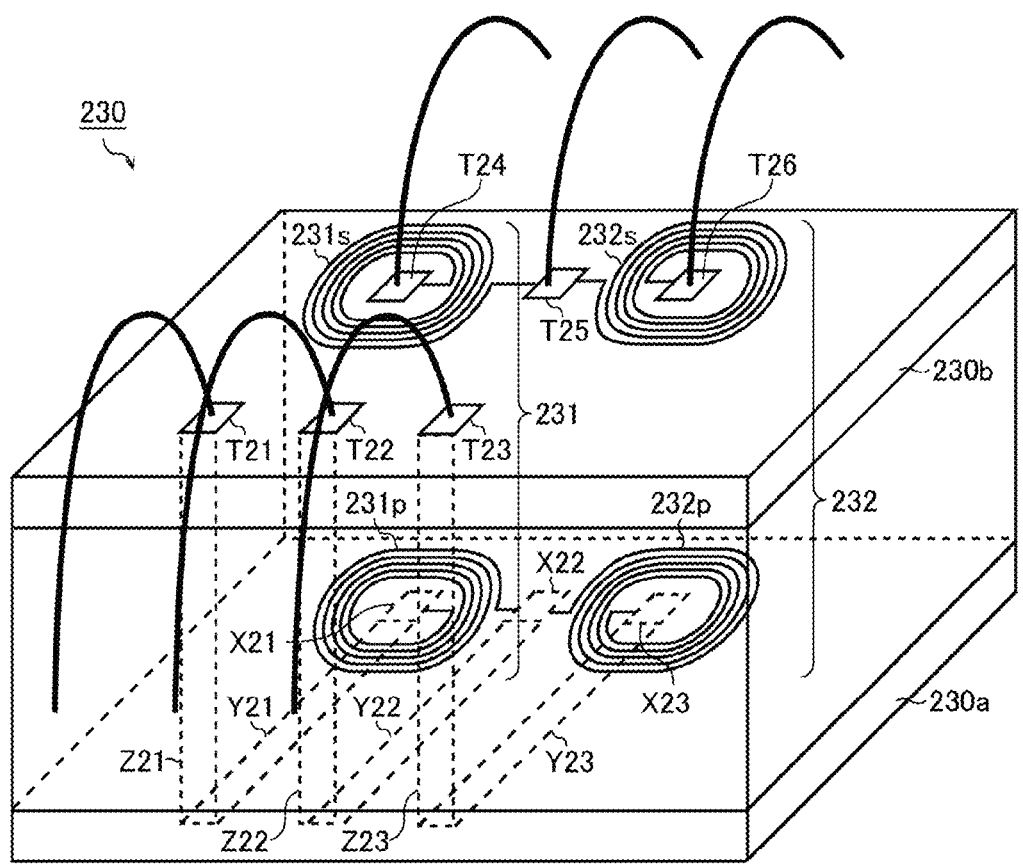
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231p and a secondary coil 231s that face each other in the up-down direction; the transformer 232 includes a primary coil 232p and a secondary coil 232s that face each other in the up-down direction.

The primary coils 231p and 232p are both formed in a first wiring layer (lower layer) 230a in the transformer chip 230. The secondary coils 231s and 231s are both formed in a second wiring layer (the upper layer in the diagram) 230b in the transformer chip 230. The secondary coil 231s is disposed right above the primary coil 231p and faces the primary coil 231p; the secondary coil 232s is disposed right above the primary coil 232p and faces the primary coil 232p.

The primary coil 231p is laid in a spiral shape so as to encircle an internal terminal X21 clockwise, starting at the first terminal of the primary coil 231p, which is connected to the internal terminal X21. The second terminal of the primary coil 231p, which corresponds to its end point, is connected to an internal terminal X22. Likewise, the primary coil 232p is laid in a spiral shape so as to encircle an internal terminal X23 anticlockwise, starting at the first terminal of the primary coil 232p, which is connected to the internal terminal X23. The second terminal of the primary coil 232p, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232s, which is connected to the external terminal T26. The second terminal of the secondary coil 232s, which corresponds to its end point, is connected to the external terminal T25. The external terminals T24, T25, and T26 are disposed in a straight row in the illustrated order and are used for wire-bonding with the driver chip 220.

The secondary coils 231s and 232s are AC-connected to the primary coils 231p and 232p, respectively, by magnetic coupling, and are DC-isolated from the primary coils 231p and 232p. That is, the driver chip 220 is AC-connected to the controller chip 210 via the transformer chip 230, and is DC-isolated from the controller chip 210 by the transformer chip 230.

Transformer Chip (Two-Channel Type)

Figure 3:
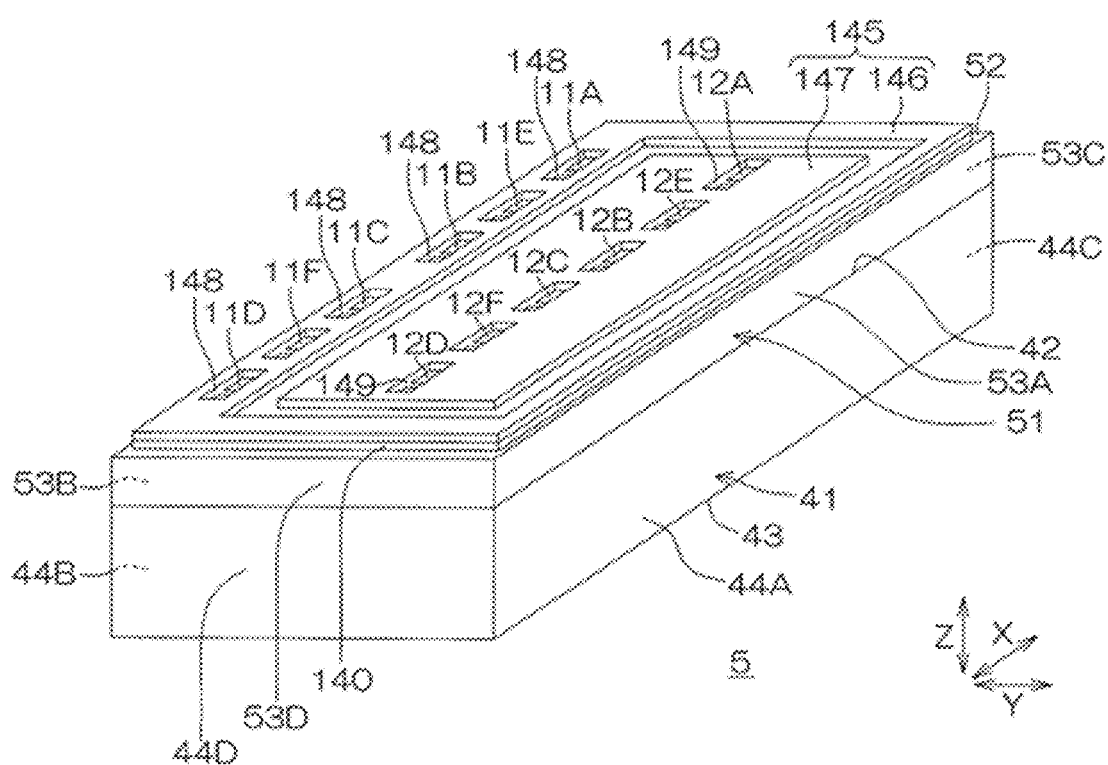
FIG. 3 a perspective view of a semiconductor device used as a two-channel transformer chip.
Figure 4:
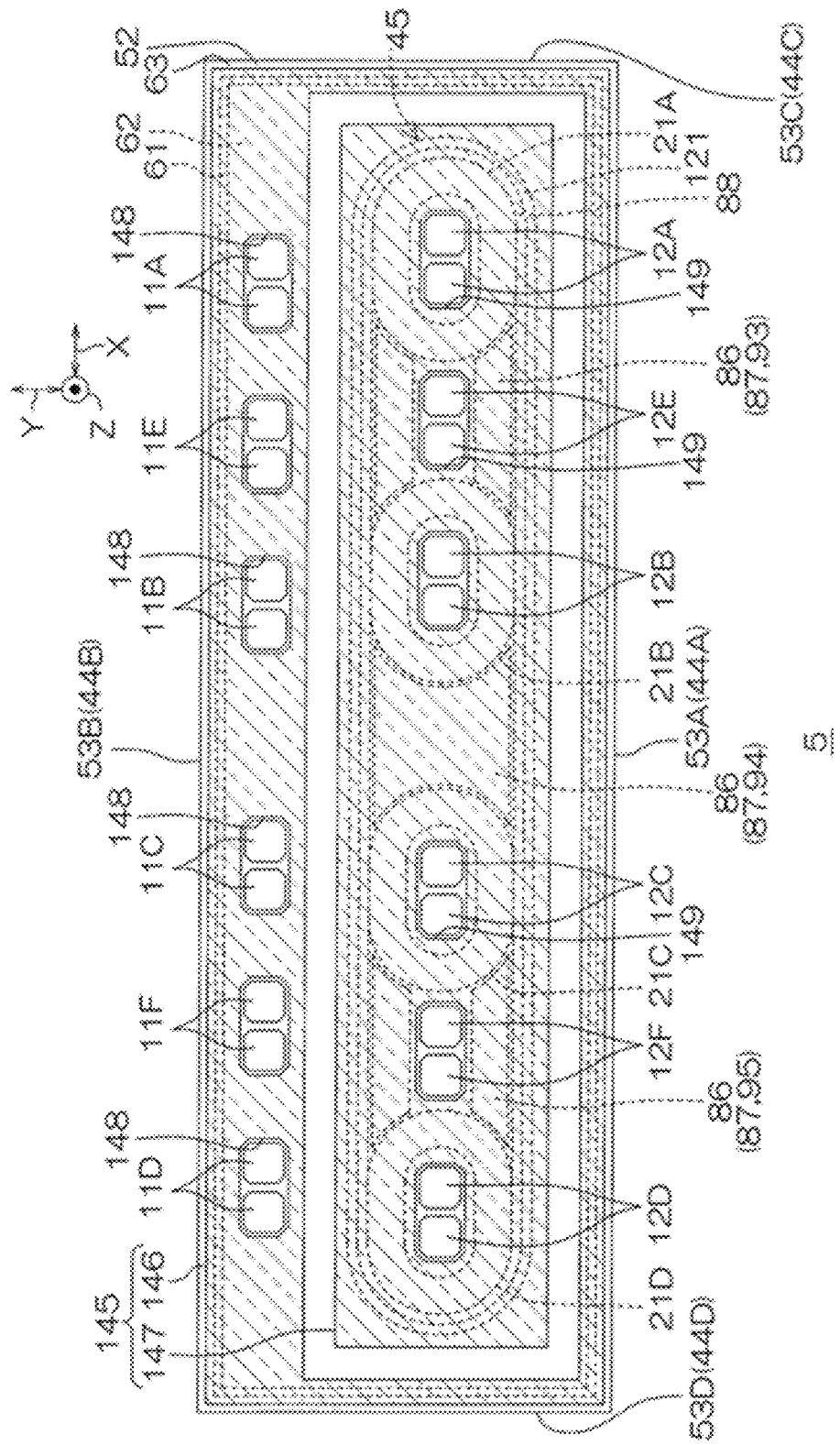
FIG. 4 is a plan view of the semiconductor device shown in FIG. 3.
Figure 5:
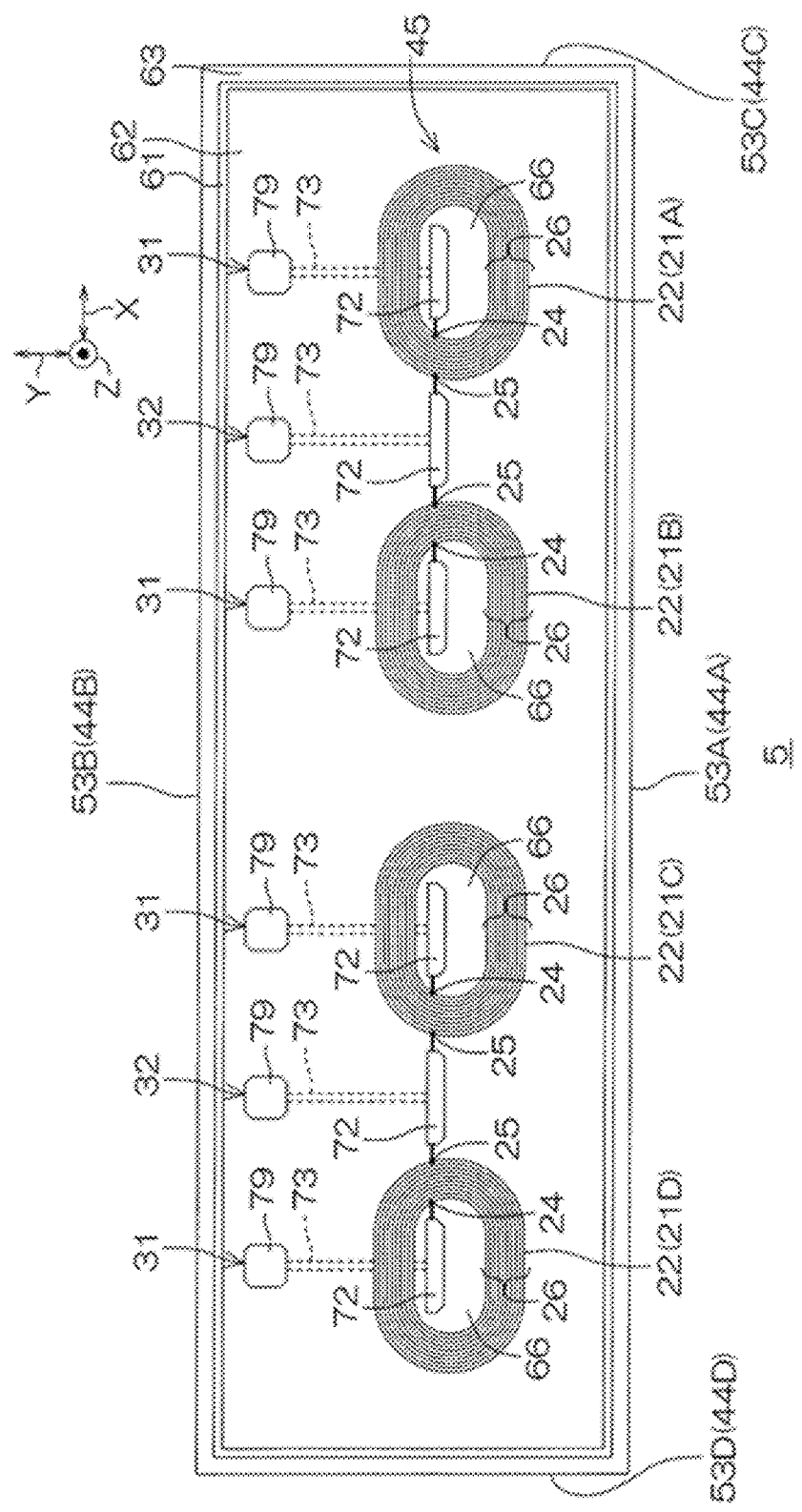
FIG. 5 is a plan view of a layer in the semiconductor device shown in FIG. 3 where low-potential coils are formed.
Figure 6:
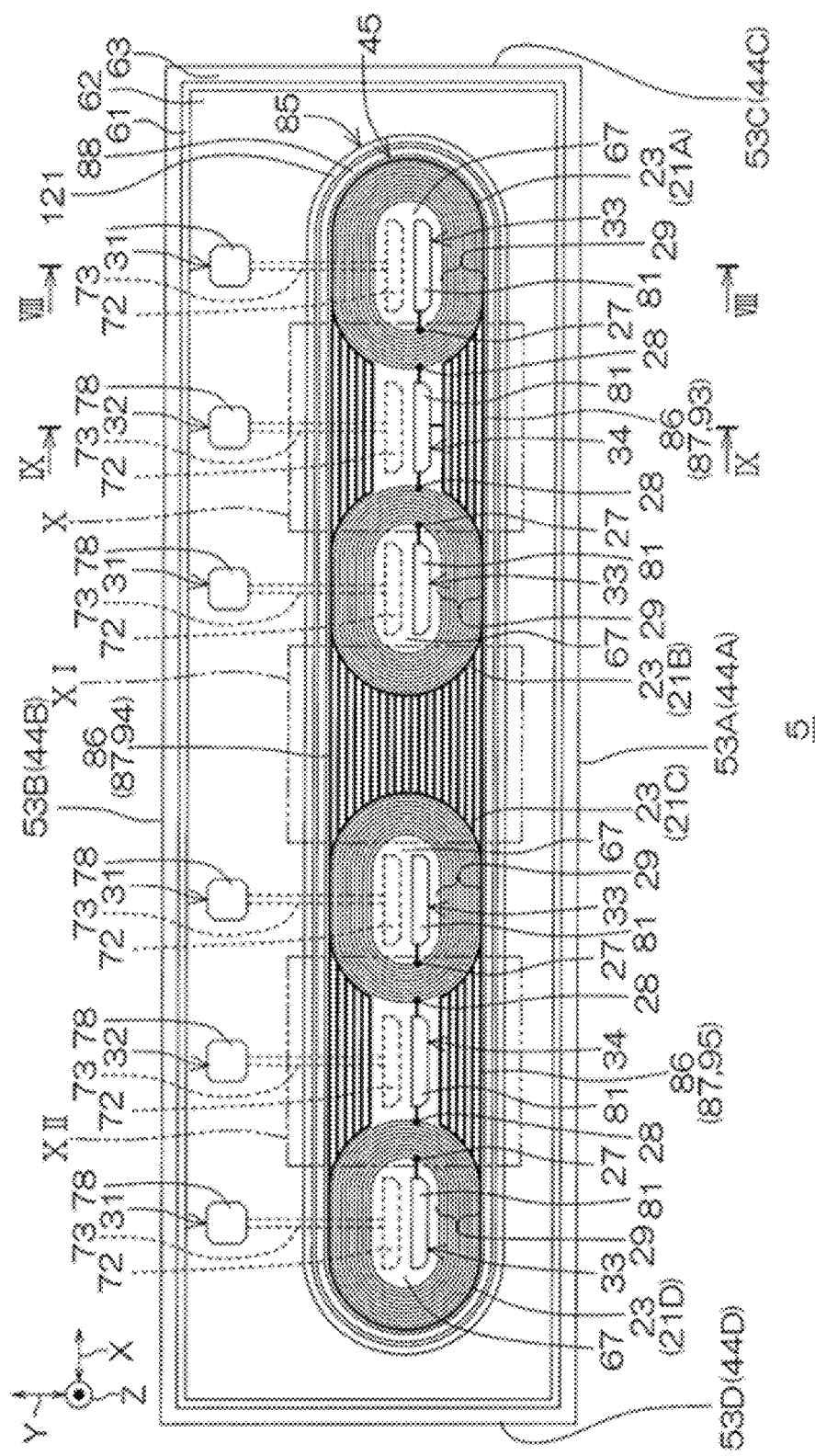
FIG. 6 is a plan view of a layer in the semiconductor device shown in FIG. 3 where high-potential coils are formed.
Figure 7:
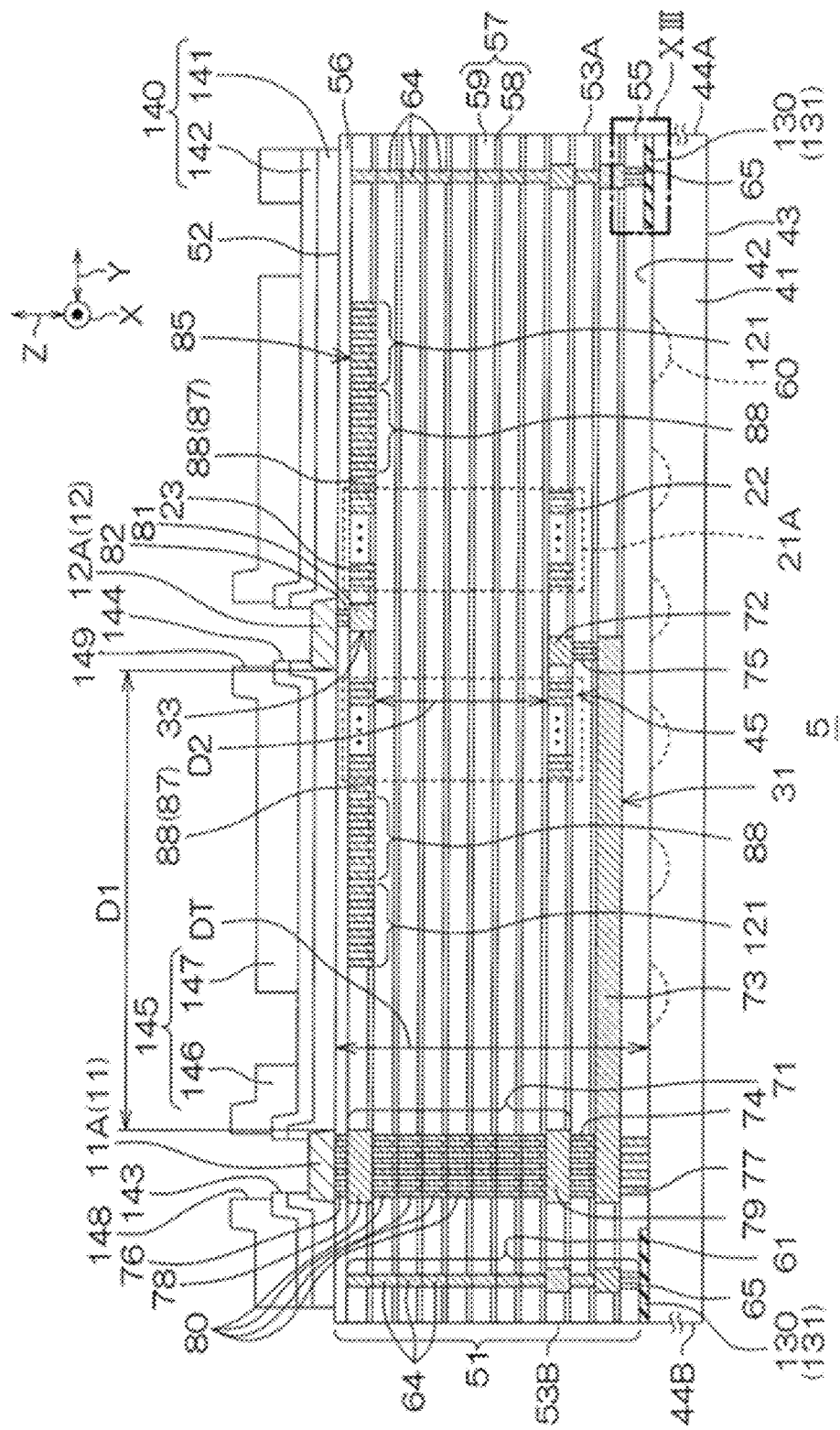
FIG. 7 is a cross-sectional view taken along line VIII-VIII shown in FIG. 6.
Figure 8:
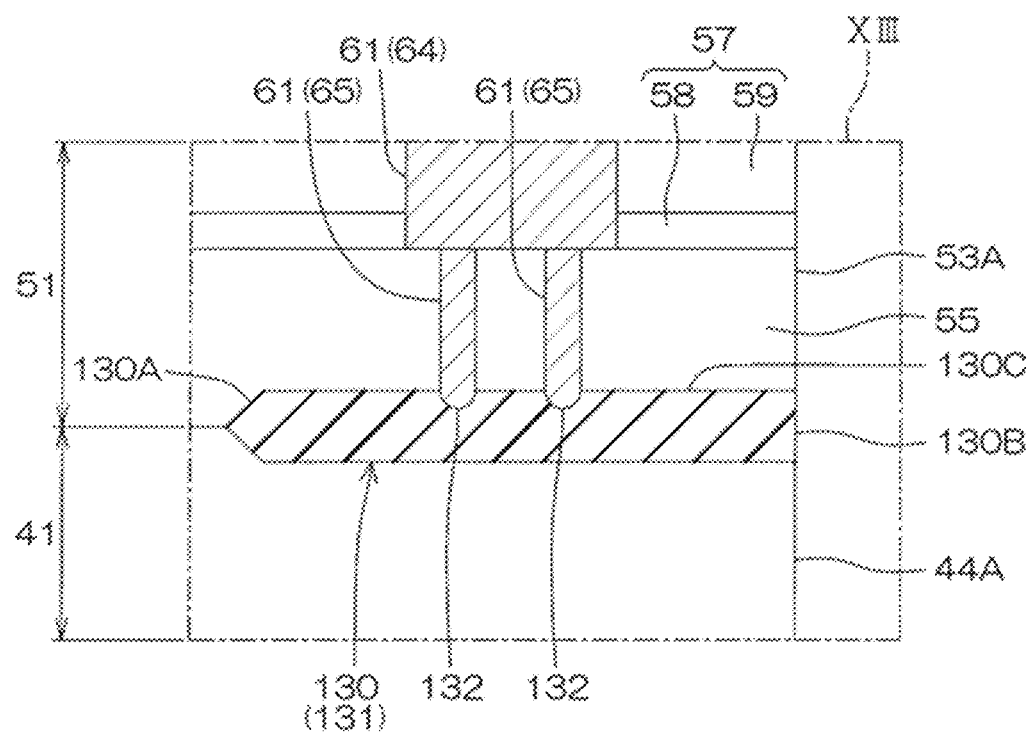
FIG. 8 is an enlarged view (showing a separation structure) of region XIII shown in FIG. 7.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6. FIG. 8 is an enlarged view of region XIII shown in FIG. 7, showing a separation structure 130.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multi-layer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of μm or more but 1 μm or less (e.g., about 0.3 μm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but 5 μm or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating lines.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 µm or more but 50 µm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 µm or more but 10 µm or less. Preferably, the organic insulation layer 145 has a thickness of 5 µm or more but 50 µm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present invention can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

Transformer Layout

Figure 9:
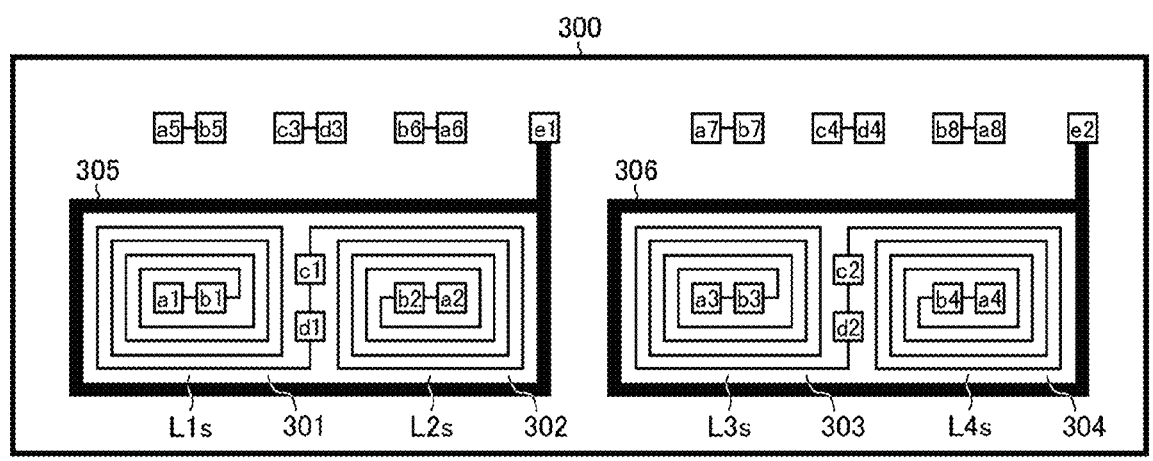
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1s of the first transformer 301, and the pads c1 and d1 are connected to the other terminal of that secondary coil L1s. The pads a2 and b2 are connected to one terminal of the secondary coil L2s of the second transformer 302, and the pads c1 and d1 are connected to the other terminal of that secondary coil L2s.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 9 does not show any of the primary coils of the first, second, third, and fourth transformers 301, 302, 303, and 304. The primary coils basically have structures similar to those of the secondary coils L1s to L4s respectively, and are disposed right below the secondary coils L1s to L4s, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1$s$ and L2$s$. The pads c2 and d2 are shared between the secondary coils L3$s$ and L4$s$. The pads c3 and d3 are shared between the primary coils L1$p$ and L2$p$. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

Traction Inverter

Figure 10:
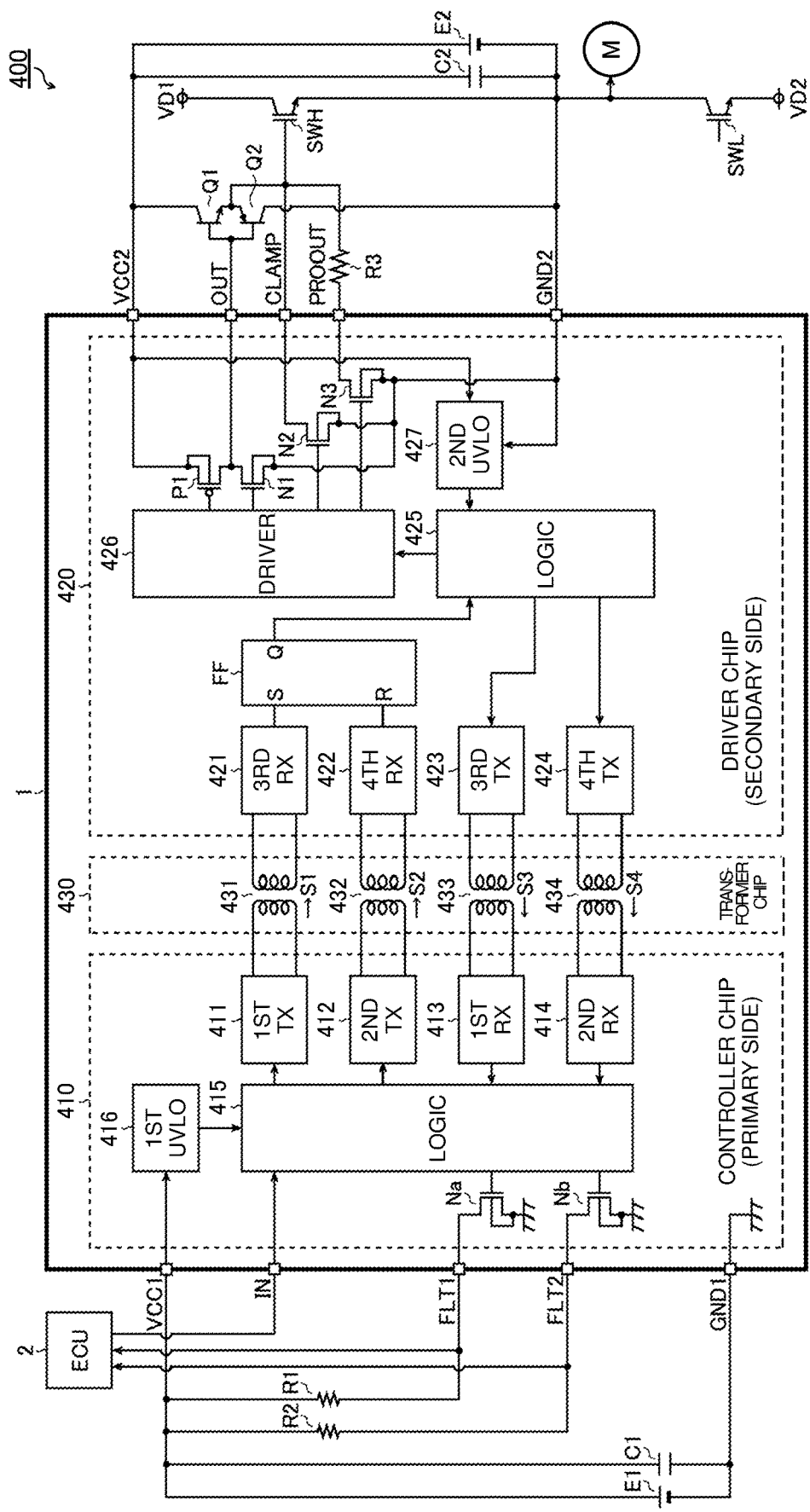
FIG. 10 is a diagram showing the basic configuration of a traction inverter.

FIG. 10 is a diagram showing the basic configuration of a traction inverter incorporated in an electric vehicle. The traction inverter 400 of this configuration example is a kind of motor driving device that converts direct-current electric power supplied from an unillustrated vehicle-mounted battery into alternating-current electric power to drive a motor M. The traction inverter 400 includes an isolated gate driver 1, an ECU (electronic control unit) 2, and various discrete components (a high-side switch SWH, a low-side switch SWL, an npn-type bipolar transistor Q1, a pnp-type bipolar transistor Q2, resistors R1 to R3, and capacitors C1 and C2).

Examples of electric vehicles (what is called xEVs) in which the traction inverter 400 can be incorporated include BEVs (battery electric vehicles), HEVs (hybrid electric vehicles), PHEVs (plug-in hybrid electric vehicles)/PHVs (plug-in hybrid vehicles), and FCEVs (fuel cell electric vehicles)/FCVs (fuel cell vehicles).

The isolated gate driver 1 is a semiconductor integrated circuit device (e.g., corresponding to the signal transmission device 200 in FIG. 1) that, while isolating between a primary circuit system (VCC1-GND1) supplied with electric power from a direct-current voltage source E1 and a secondary circuit system (VCC2-GND2) that is supplied with electric power from a direct-current voltage source E2, transmits a gate driving signal from the primary circuit system to the secondary circuit system.

The isolated gate driver 1 has, as means for establishing electrical connection with outside it, a plurality of external terminals (of which some are shown in the diagram, namely a VCC1 terminal, an IN terminal, an FLT1 terminal, an FLT2 terminal, a GND1 terminal, a VCC2 terminal, an OUT terminal, a CLAMP terminal, a PROOUT terminal, and a GND2 terminal).

The VCC1 terminal is the power terminal of the primary circuit system. The IN terminal is a control input terminal. The FLT1 and FLT2 terminals are each a fault signal output terminal. The GND1 terminal is the ground terminal of the primary circuit system. The VCC2 terminal is the power terminal of the secondary circuit system. The OUT terminal is an output terminal. The CLAMP terminal is a mirror clamp terminal. The PROOUT terminal is a soft turn-off terminal. The GND2 terminal is the ground terminal of the secondary circuit system.

The internal configuration and the operation of the isolated gate driver 1 will be described in detail later.

The ECU 2 serves as a means for comprehensive electrical control of an electric vehicle, and engages in exchange of various signals (an input signal IN, external fault signals FLT1 and FLT2, etc.) with the isolated gate driver 1.

The discrete components are interconnected as follows. The resistor R1 is connected between the VCC1 terminal and the FLT1 terminal. The resistor R2 is connected between the VCC1 terminal and the FLT2 terminal. The resistor R3 is connected between the CLAMP terminal and the PROOUT terminal. The capacitor C1 is connected between the VCC1 terminal and the GND1 terminal. The capacitor C2 is connected between the VCC2 terminal and the GND2 terminal.

The collector of the transistor Q1 is connected to the VCC2 terminal. The emitters of the transistors Q1 and Q2 and the control terminal (e.g., gate) of the high-side switch SWH are all connected to the CLAMP terminal. The collector of the transistor Q2 is connected to the GND2 terminal. The bases of the transistors Q1 and Q2 are both connected to the OUT terminal.

The high-side and low-side switches SWH and SWL are connected, respectively, between an application terminal for a first motor driving voltage VD1 and an input terminal of the motor M corresponding to the relevant phase (specifically, one end of the motor coil of that phase) and between the input terminal of the motor M corresponding to the relevant phase and an application terminal for a second motor driving voltage VD2 (<VD1). As these switches SWH and SWL are turned on and off, they control the supply of a motor driving current, thus constituting a half-bridge output stage.

In the traction inverter 400 of this configuration example, the high-side and low-side switches SWH and SWL are implemented with insulated-gate bipolar transistors (IGBTs). This, however, is not meant to limit the configuration of the half-bridge output stage: instead, they may be implemented with MOS (metal-oxide-semiconductor) field-effect transistors using a SiC (silicon carbide) semiconductor or MOS field-effect transistors using a Si semiconductor. In particular, MOS field-effect transistors using a SiC, for their low power consumption and high heat resistance as compared with MOS field-effect transistors using a Si semiconductor, are suitable for use on electric vehicles.

For the sake of convenience, the diagram only shows the half-bridge output stage corresponding to one phase and the isolated gate driver 1 connected to the high-side switch SWH. In reality, an isolated gate driver 1 is connected to each of the high-side and low-side switches SWH and SWL constituting the half-bridge output stage of each phase. Accordingly, in a case where the motor M is a three-phase AC (alternating-current) motor, there are provided half-bridge output stages for three phases, and these require a total of six isolated gate drivers 1.

Isolated Gate Driver (Basic Configuration)

With reference still to FIG. 10. The isolated gate driver 1 will be described in detail. The isolated gate driver 1 has a first semiconductor chip 410, a second semiconductor chip 420, and a third semiconductor chip 430 sealed in a single package.

The first semiconductor chip 410 is a controller chip that has integrated in it a controller that is driven by being supplied with a supply voltage VCC1 (e.g., 5 V or 3.3 V relative to GND1) from the direct-current voltage source E1 to generate switch control signals S1 and S2 based on an input signal IN. The first semiconductor chip 410 has the following main functions: generating the switch control signals S1 and S2; generating external fault signals FLT1 and FLT2; and performing UVLO (undervoltage lock-out). The first semiconductor chip 410 can be designed to have an appropriate withstand voltage (e.g., 7 [V]) with consideration given to the supply voltage VCC1 (relative to GND1).

The second semiconductor chip 420 is a driver chip that has integrated in it a driver that is driven by being supplied with a supply voltage VCC2 (10 to 30 V relative to GND2) from the direct-current voltage source E2 to control the driving of the high-side switch SWH, of which one terminal is fed with a voltage as high as several hundred volts, based on the switch control signals S1 and S2 fed from the first semiconductor chip 410 via the third semiconductor chip 430. The second semiconductor chip 420 has the following main functions: generating an output signal OUT; generating internal fault signals S3 and S4; and performing UVLO. The second semiconductor chip 420 can be designed to have an appropriate withstand voltage (e.g., 40 [V]) with consideration given to the supply voltage VCC2 (relative to GND2).

The third semiconductor chip 430 is a transformer chip that has integrated in it a transformer that, while isolating between the first and second semiconductor chips 410 and 420 on a direct-current basis, exchanges the switch control signals S1 and S2 and the internal fault signals S3 and S4.

As described above, the isolated gate driver 1 of this configuration example has, separately from the first semiconductor chip 410 having a controller integrated in it and the second semiconductor chip 420 having a driver integrated in it, the transformer chip 430 incorporating a transformer alone, and these three chips are sealed in a single package.

With this configuration, the first and second semiconductor chips 410 and 420 can each be formed by a common low-withstand-voltage process (with a withstand voltage of several volts to several tens of volts). This eliminates the need for a dedicated high-withstand-voltage process (with a withstand voltage of several kilovolts), and helps reduce manufacturing costs.

Moreover, the first and second semiconductor chips 410 and 420 can each be fabricated by a time-proven existing process. This eliminates the need for conducting reliability tests anew, and contributes to a shortened development period and reduced development costs.

Next, the internal configuration of each of the first, second, and third semiconductor chips 410, 420, and 430 incorporated in the isolated gate driver 1 will be described in detail one by one.

The first semiconductor chip 410 includes a first transmitter 411, a second transmitter 412, a first receiver 413, a second receiver 414, a logic circuit 415, a first UVLO circuit 416, and N-channel MOS field-effect transistors Na and Nb.

The second semiconductor chip 420 includes a third receiver 421, a fourth receiver 422, a third transmitter 423, a fourth transmitter 424, a logic circuit 425, a driver 426, a second UVLO circuit 427, a P-channel MOS field-effect transistor P1, N-channel MOS field-effect transistors N1 to N3, and an SR flip-flop FF.

The third semiconductor chip 430 includes a first transformer 431, a second transformer 432, a third transformer 433, and a fourth transformer 434.

The first transmitter 411 transmits the switch control signal S1, which is fed from the logic circuit 415, to the third receiver 421 via the first transformer 431.

The second transmitter 412 transmits the switch control signal S2, which is fed from the logic circuit 415, to the fourth receiver 422 via the second transformer 432.

The first receiver 413 receives the internal fault signal S3, which is fed from the third transmitter 423 via the third transformer 433, to deliver the internal fault signal S3 to the logic circuit 415.

The second receiver 414 receives the internal fault signal S4, which is fed from the fourth transmitter 424 via the fourth transformer 434, to deliver the internal fault signal S4 to the logic circuit 415.

The logic circuit 415 exchanges various signals (the input signal IN and the external fault signals FLT1 and FLT2) with the ECU 2, and exchanges various signals (S1 to S4) with the second semiconductor chip 420 by using the first transmitter 411, the second transmitter 412, the first receiver 413, and the second receiver 414.

If the input signal IN is at high level, the logic circuit 415 generates a pulse in the switch control signal S1 to turn the output signal OUT to high level; by contrast, if the input signal IN is at low level, the logic circuit 415 generates a pulse in the switch control signal S2 to turn the output signal OUT to low level. For example, the logic circuit 415 raises a pulse in the switch control signal S1 by detecting a positive edge (a rising edge from low level to high level) in the input signal IN, and raises a pulse in the switch control signal S2 by detecting a negative edge (a falling edge from high level to low level) in the input signal IN.

Moreover, according to the state of the isolated gate driver 1, the logic circuit 415 turns the transistors Na and Nb on and off to switch the logic levels of the external fault signals FLT1 and FLT2.

The drains of the transistors Na and Nb are connected to the FLT1 and FLT2 terminals respectively. The sources of the transistors Na and Nb are both connected to the ground terminal (i.e., the GND1 terminal) of the primary circuit system. The gates of the transistors Na and Nb are both connected to the logic circuit 415.

For example, so long as the isolated gate driver 1 has no fault, the transistors Na and Nb are both off, so that the FLT1 and FLT2 are both in a high-impedance state (a state pulled up by the resistor R1). In this state, the external fault signals FLT1 and FLT2 are both at high level (=VCC1). By contrast, if the isolated gate driver 1 has some fault, at least one of the transistors Na and Nb is on, so that at least one of the FLT1 and FLT2 is in a state short-circuited to the ground. In this state, at least one of the external fault signals FLT1 and FLT2 is at low level (=GND1). With this configuration, the ECU 2 can, by monitoring the external fault signals FLT1 and FLT2, grasp the state of the isolated gate driver 1. This function, fault output function, will be described in detail later.

The first UVLO circuit 416 monitors whether the supply voltage VCC1 is in an undervoltage state and delivers the monitoring result to the logic circuit 415.

The third receiver 421 receives the switch control signal S1, which is fed from the first transmitter 411 via the first transformer 431, to deliver the switch control signal S1 to the set input terminal (S) of the SR flip-flop FF.

The fourth receiver 422 receives the switch control signal S2, which is fed from the second transmitter 412 via the second transformer 432, to deliver the switch control signal S2 to the reset input terminal (R) of the SR flip-flop FF.

The third transmitter 423 transmits the internal fault signal S3, which is fed from the logic circuit 425, to the first receiver 413 via the third transformer 433.

The fourth transmitter 424 transmits the internal fault signal S4, which is fed from the logic circuit 425, to the second receiver 414 via the fourth transformer 434.

Triggered by a pulse edge in the switch control signal S1 fed to its set input terminal (S), the SR flip-flop FF sets the logic level at its output terminal (Q) to high level. Triggered by a pulse edge in the switch control signal S2 fed to its reset input terminal (R), the SR flip-flop FF resets the logic level at its output terminal (Q) to low level. Thus, the output signal fed from the SR flip-flop FF to the logic circuit 425 is a pulse signal that has the same logic level as the input signal IN fed from the ECU 2 to the logic circuit 415.

Based on the output signal of the SR flip-flop FF, the logic circuit 425 generates a driving signal for the driver 426. If the second UVLO circuit 427 detects an undervoltage fault, the logic circuit 425 sends a corresponding notification directly to the driver 426 and also, by using the internal fault signal S3, to the logic circuit 415. With this configuration, even if the second semiconductor chip 420 has an undervoltage fault, the driver 426 can promptly perform protection operation, and the logic circuit 415 can perform fault output to the ECU 2.

Though not specifically shown in the diagram, the second semiconductor chip 420 may include any fault detector other than the second UVLO circuit 427 (such as an overvoltage detector OVP [overvoltage protection], a short-circuit detector SCP [short-circuit protection], or an overtemperature detector OTP [overtemperature protection]). In that case, if any fault is detected in the second semiconductor chip 420, as in the case described above, protection operation can be performed for the driver 426 and fault output can be performed to the logic circuit 415 (hence the ECU 2) by use of the internal fault signal S3.

As will be described in detail later, the second semiconductor chip 420 may include a non-volatile memory for use as registers. In that case, if an error is detected in the data stored in the non-volatile memory, fault output may be performed to the logic circuit 415 (hence the ECU 2) by use of, for example, the internal fault signal S4 provided separately from the internal fault signal S3 mentioned above.

The source of the transistor P1 is connected to the VCC2 terminal. The drains of the transistors P1 and N1 are both connected to the OUT terminal. The drain of the transistor N2 is connected to the CLAMP terminal. The drain of the transistor N3 is connected to the PROOUT terminal. The sources of the transistors N1 to N3 are all connected to the GND2 terminal. The gates of the transistors P1 and N1 to N3 are all connected to the driver 426.

The driver 426 turns on and off the transistors P1 and N1 based on a driving signal fed from the logic circuit 425 to output the output signal OUT from the connection node between the transistors P1 and N1. The output signal OUT is fed via a driving circuit constituted by the transistors Q1 and Q2 to the high-side switch SWH. In the driving circuit just mentioned, the rising/falling time (slew rate) of the output signal OUT is set such that the output signal OUT has the capacity to drive the high-side switch SWH. Here, when the output signal OUT is at high level, the high-side switch SWH is on; when the output signal OUT is at low level, the high-side switch SWH is off.

The driver 426 has a function (active mirror clamp function) of, in response to the voltage level of the output signal OUT (relative to GND2) turning to low level, turning on the transistor N2 so as to draw electric charge (mirror current) from the gate of the high-side switch SWH via the CLAMP terminal. With this configuration, when the high-side switch SWH is turned off, it is possible to promptly drop the gate potential of the high-side switch SWH to low level via the transistor N2 regardless of the slew rate set by the driving circuit mentioned above.

The driver 426 also has a function (soft turn-on function) of, on recognizing the need for protection operation based on a fault detection signal fed from the logic circuit 425, turning the transistors P1, N1, and N2 all off and the transistor N3 on. Such switching permits electric charge to be drawn more gently from the gate of the high-side switch SWH via the resistor R3 during protection operation than during normal operation. This configuration helps avoid an instantaneous break of the motor current during protection operation, and thus helps suppress a surge ascribable to a back electromotive force in the motor coil. The falling time during protection operation can be adjusted as desired by appropriately selecting the resistance value of the resistor R3.

The second UVLO circuit 427 monitors whether the supply voltage VCC2 is in an undervoltage state and delivers the monitoring result to the logic circuit 425.

The first transformer 431 is a direct-current isolation element for transmitting the switch control signal S1 from the first semiconductor chip 410 to the second semiconductor chip 420.

The second transformer 432 is a direct-current isolation element for transmitting the switch control signal S2 from the first semiconductor chip 410 to the second semiconductor chip 420.

The third transformer 433 is a direct-current isolation element for transmitting the internal fault signal S3 from the second semiconductor chip 420 to the first semiconductor chip 410.

The fourth transformer 434 is a direct-current isolation element for transmitting the internal fault signal S4 from the second semiconductor chip 420 to the first semiconductor chip 410.

With this configuration where not only the switch control signals S1 and S2 but also the internal fault signals S3 and S4 are exchanged between the first and second semiconductor chips 410 and 420, it is possible not only to turn on and off the high-side switch SWH but also to carry out various fault detection functions appropriately.

Here is a review of the different functions of the isolated gate driver 1 of this configuration example.

UVLO1 (Controller-Side Undervoltage-Induced Malfunctioning Prevention Function)

If the supply voltage VCC1 becomes equal to or lower than a predetermined low-side threshold voltage $V_{UVLO1L}$, the isolated gate driver 1 turns off the high-side switch SWH and keeps the FLT1 terminal at low level. If the supply voltage VCC1 becomes equal to or higher than a predetermined high-side threshold voltage $V_{UVLO1L}$, the isolated gate driver 1 starts normal operation and keeps the FLT1 terminal in a high-impedance state (at high level).

UVLO2 (Driver-Side Undervoltage-Induced Malfunctioning Prevention Function)

If the supply voltage VCC2 becomes equal to or lower than a predetermined low-side threshold voltage $V_{UVLO2L}$, the isolated gate driver 1 turns off the high-side switch SWH and keeps the FLT1 terminal at low level. If the supply voltage VCC2 becomes equal to or higher than a predetermined high-side threshold voltage $V_{UVLO2H}$, the isolated gate driver 1 starts normal operation and keeps the FLT1 terminal in a high-impedance state (at high level).

Soft Turn-Off During Protection Operation

When forcibly turning off the high-side switch SWH, the isolated gate driver 1 turns the PROOUT terminal to low level and brings the OUT terminal into a high-impedance state. This control permits the high-side switch SWH to be turned off slowly. The slew rate during its turning-off can be adjusted as desired by appropriately selecting the resistance value of the externally connected resistor R3.

Active Mirror Clamp

When the gate potential of the high-side switch SWH becomes equal to or lower than a predetermined threshold voltage $V_{AMC}$, the isolated gate driver 1 turns the CLAMP terminal to low level. This control permits reliable turning-off of the high-side switch SWH.

A Study on Set Size and Cost Reduction

In the traction inverter 400, optimizing the switching characteristics of a switching element (e.g., the high-side switch SWH) implemented with an IGBT or the like and the operating threshold values of a fault detector (such as an overvoltage detector OVP, short-circuit detector SCP, or overtemperature detector OTP) will lead to reducing safety margins against heating and destruction of the switching element. This helps reduce the chip size of the switching element and thus helps achieve size reduction and cost reduction of sets.

Specifically, a characteristic of the isolated gate driver 1, for example the driving speed of the gate driver (i.e., the slew rate), or the detection threshold value or cancellation threshold value of a fault detector, can be left adjustable as desired according to the individual variation (manufacturing variation) of the switching element. Presented below will be a novel embodiment devised to achieve that.

Isolated Gate Driver (Embodiment)

Figure 11:
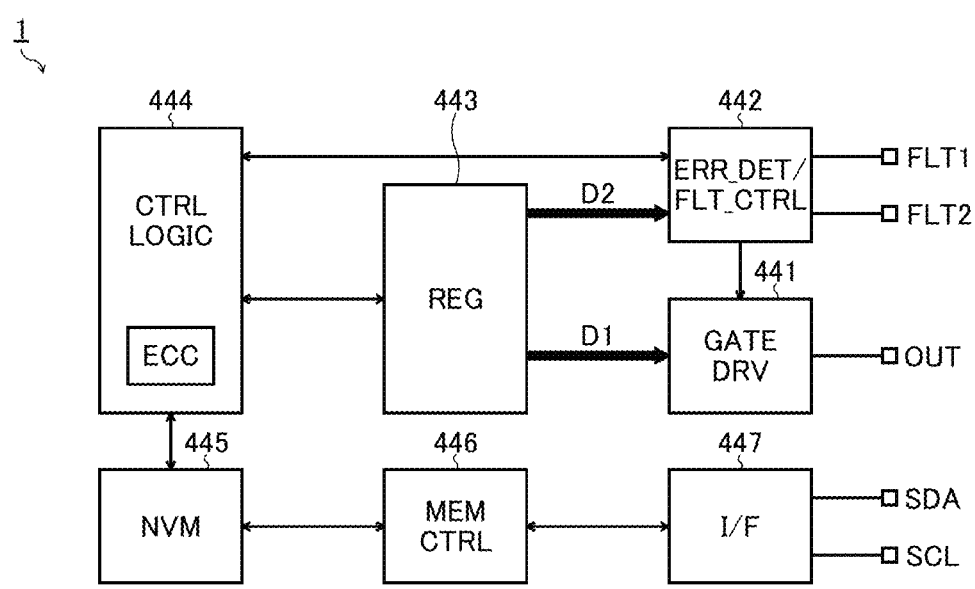
FIG. 11 is a diagram showing a novel embodiment of an isolated gate driver.

FIG. 11 is a diagram showing a novel embodiment of the isolated gate driver 1. The isolated gate driver 1 according to this embodiment includes a gate driver 441, a fault detector-controller 442, a register 443, a control logic 444, a non-volatile memory 445, a memory controller 446, and an interface 447. The following description assumes basically that these components are integrated in the second semiconductor chip 420 (driver chip) in the isolated gate driver 1.

The gate driver 441 is a circuit block that corresponds to the driver 426 in FIG. 10. The gate driver 441 generates the output signal OUT based on the driving signal fed from the logic circuit 425 (not shown in the diagram), thereby to drive the gate of the high-side switch SWH. The gate driver 441 is switched between an enabled and a disabled state based on a fault detection signal fed from the fault detector-controller 442. The characteristics of the gate driver 441 can be adjusted as desired based on values (in the diagram, adjustment data D1) stored in the register 443. The characteristics include, for example, the driving speed of the gate driver 441, that is, the rising/falling time (slew rate) of the output signal OUT.

The fault detector-controller 442 has combined functions as a fault detector (such as an overvoltage detector OVP, short-circuit detector SCP, or overtemperature detector OTP) that detects a fault elsewhere than in the non-volatile memory 445 and as a fault controller that feeds the external fault signals FLT1 and FLT2 to the ECU 2 via the FLT1 and FLT2 terminals. For example, the FLT1 terminal corresponds to a first external terminal for feeding out the result of fault detection elsewhere than in the non-volatile memory 445, and the FLT2 terminal corresponds to a second external terminal for feeding out the result of error detection in the non-volatile memory 445. The characteristics of the fault detector-controller 442 can be adjusted as desired according to values (in the diagram, adjustment data D2) stored in the register 443. The characteristics include, for example, the detection threshold value or cancellation threshold value referred to in a check for a fault.

Here, the fault detector-controller 442 includes, as its components, a fault signal transmission mechanism for transmitting fault detection results from the second semiconductor chip 420 to the first semiconductor chip 410 (e.g., the first receiver 413, the second receiver 414, the third transmitter 423, the fourth transformer 434, the third transformer 433, and the fourth transformer 434 in FIG. 10) and a fault terminal control mechanism for controlling the FLT1 and FLT2 terminals (e.g., the logic circuit 415 and the transistors Na and Nb in FIG. 10). Accordingly, the fault detector-controller 442 can be understood not to have all its components integrated in the second semiconductor chip 420 but have its components integrated in, in a fashion distributed among, the first, second, and third semiconductor chips 410, 420, and 430.

The register 443 stores on a non-volatile basis the adjustment data read from the non-volatile memory 445 by the control logic 444 (i.e., in the diagram, the adjustment data D1 for the gate driver 441 and the adjustment data D2 for the fault detector-controller 442).

Every time the traction inverter 400 starts up (i.e., every time the isolated gate driver 1 starts receiving power), the control logic 444 reads the adjustment data D1 and D2 from the non-volatile memory 445 and stores it in the register 443. Here, the control logic 444 has a function of controlling the fault detector-controller 442 so as to keep the gate driver 441 in a disabled state until the adjustment data D1 and D2 read from the non-volatile memory 445 completes being stored in the register 443 (this will be described in detail later). Also, the control logic 444 incorporates an error detection-correction circuit ECC (error check and correct) that performs error detection and error correction with respect to the adjustment data D1 and D2 written to the non-volatile memory 445 (this will be described in detail later).

The non-volatile memory 445 stores on a non-volatile basis the adjustment data for the isolated gate driver 1 (i.e., in the diagram, the adjustment data D1 for the gate driver 441 and the adjustment data D2 for the fault detector-controller 442). While in this embodiment the non-volatile memory 445 is incorporated in the isolated gate driver 1, it may instead be externally connected to the isolated gate driver 1 (a specific example will be described later).

The memory controller 446 performs address control and the like with respect to the non-volatile memory 445 when the non-volatile memory 445 is accessed (e.g., to read or write the adjustment data D1 and D2) from outside the isolated gate driver 1 via the interface 447.

The interface 447 is a front end via which to access the non-volatile memory 445 from outside the isolated gate driver 1. The interface 447 can be implemented with, for example, a two-line serial interface complying with the I2C (inter-integrated circuit) standard that conducts bidirectional serial communication by use of a data signal SDA and a clock signal SCL.

With the isolated gate driver 1 according to this embodiment, by reading the adjustment data D1 and D2 previously written to the non-volatile memory 445 and storing it in the register 443, it is possible to optimize, based on the values stored in the register 443, the characteristics of each of the gate driver 441 and the fault detector-controller 442. It is thus possible to reduce margins against heating and destruction of the switching element (e.g. the high-side switch SWH), and thus to reduce the chip size of the switching element and achieve size reduction and cost reduction of sets.

If, however, the gate driver 441 operates before the characteristics of each of the gate driver 441 and the fault detector-controller 442 complete being set, that is, in other words, before the adjustment data D1 and D2 completes being stored in the register 443, the switching element may be driven with inappropriate characteristics with no consideration given to the individual (manufacturing) variation of the switching element. In such a situation, the reduced safety margins can act adversely, leading to failure of the switching element.

Considering in particular that the register 443 is a kind of volatile memory, the above sequence of operation of reading the adjustment data D1 and D2 from the non-volatile memory 445 and storing it in the register 443 is repeated every time the traction inverter 400 is powered up. Thus, the start-up sequence from powering-up to the start of gate driving needs to be well designed.

Start-Up Sequence

Figure 12:
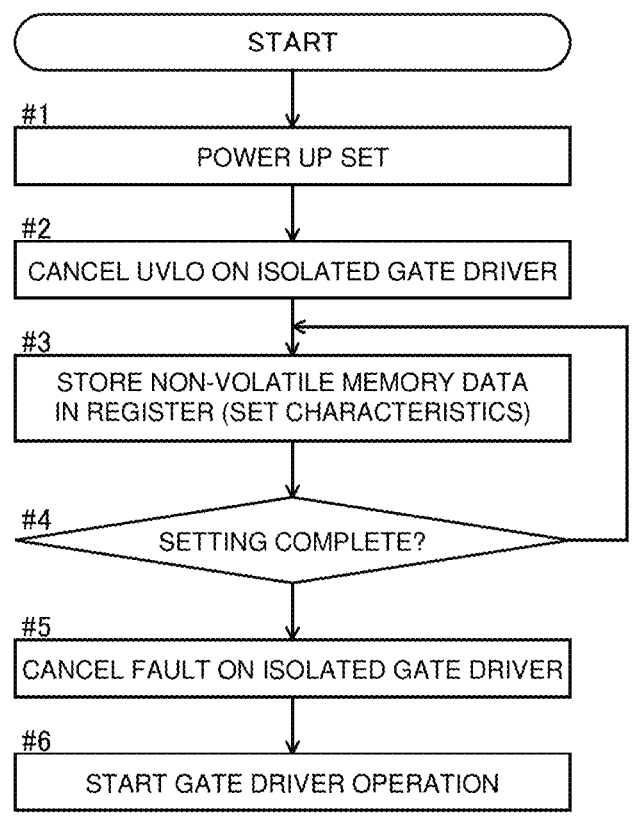
FIG. 12 is a diagram showing a start-up sequence of an isolated gate driver.

FIG. 12 is a flow chart showing the start-up sequence of the isolated gate driver 1. The sequence proceeds as follows. At step #1, a set (i.e., the traction inverter 400) is powered up, so that the isolated gate driver 1 starts to be supplied with the supply voltages VCC1 and VCC2.

At step #2, as the supply voltages VCC1 and VCC2 rise, the ULVO on the isolated gate driver 1 is cancelled. At this point, however, the reading of the adjustment data D1 and D2 from the non-volatile memory 445 has not been started yet and thus, naturally, its storing in the register 443 and hence the adjustment of the characteristics of each of the gate driver 441 and the fault detector-controller 442 has not been completed. Accordingly, the gate driver 441 is kept in a disabled state. The gate driver 441 can be kept in a disabled state, for example, by keeping the fault detection signal fed from the fault detector-controller 442 to the gate driver 441 at a logic level indicating a fault being detected.

At step #3, the control logic 444 reads the adjustment data D1 and D2 from the non-volatile memory 445 and stores it in the register 443.

At step #4, a check is made for completion of the storing of data in the register 443 and hence completion of the adjustment of the characteristics of each of the gate driver 441 and the fault detector-controller 442. If the check result is "yes", the sequence proceeds to step #5; if the check result is "no", the sequence returns to step #3 to continue, with the gate driver 441 kept in a disabled state, the storing of data in the register 443.

If, at step #3, the storing of data in the register 443 is complete, the characteristics of each of the gate driver 441 and the fault detector-controller 442 are optimized and thus the switching element (e.g., the high-side switch SWH) is now ready to be driven. Accordingly, if the sequence advances via step #4 resulting in "yes" to step #5, the isolated gate driver 1 becomes fault-released and the fault detection signal fed to the gate driver 441 is turned from the logic level indicating a fault being detected to a logic level indicating no fault being detected.

As a result, at the subsequent step, #6, the gate driver 441 is released from the disabled state and the switching element starts to be driven and controlled according to the input signal IN (normal operation).

As will be understood from the sequence of operation described above, the isolated gate driver 1 employs a start-up sequence that keeps the gate driver 441 in a disabled state until the characteristics of each of the gate driver 441 and the fault detector-controller 442 complete being set, in other words, until the adjustment data D1 and D2 completes being stored in the register 443.

With this configuration, even if the input signal IN is fed in from the ECU 2 before the setting of the characteristics of each of the gate driver 441 and the fault detector-controller 442, the switching element is prevented from being driven with inappropriate characteristics with no consideration given to its individual (manufacturing) variation. Thus, operating the switching element with reduced safety margins is less likely to cause failure of the switching element.

Examples of Implementation of a Non-Volatile Memory

Figure 13:
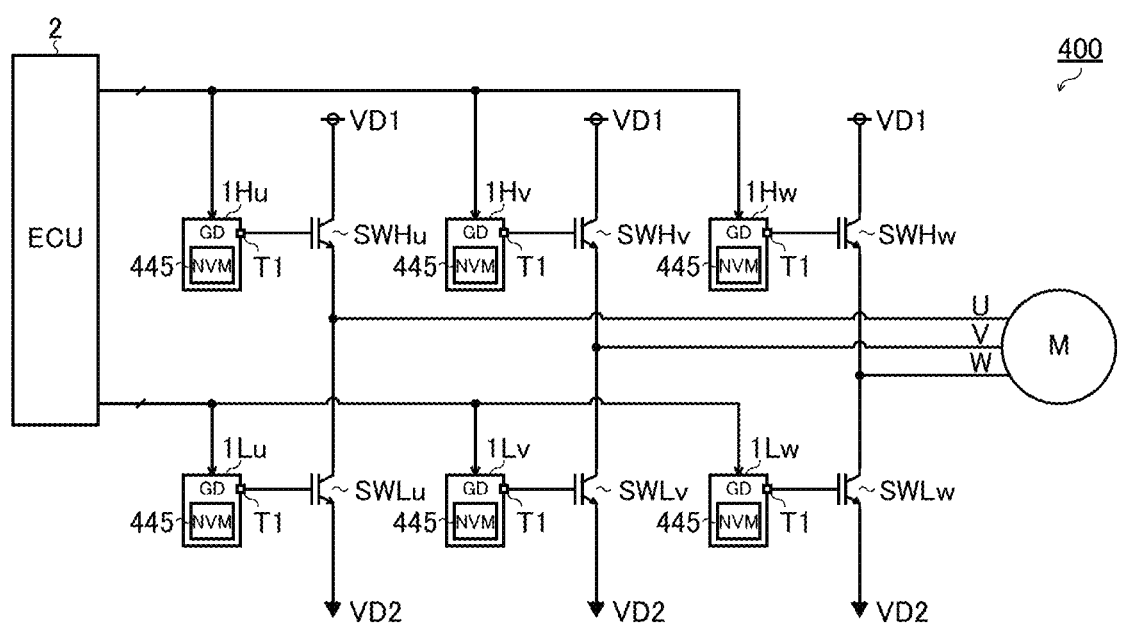
FIG. 13 is a diagram showing a first implementation example of a non-volatile memory.

FIG. 13 is a diagram showing a first implementation example of the non-volatile memory 445. The traction inverter 400 of the first implementation example is, as mentioned earlier, a kind of motor driving device that controls the driving of a motor M, and includes three isolated gate drivers 1H(u/v/w), three isolated gate drivers 1L(u/v/w), three high-side switches SWH(u/v/w), three low-side switches SWL(u/v/w), and an ECU 2.

The motor M is a three-phase motor that is driven to rotate according to three-phase driving voltages U/V/W fed from half-bridge output stages corresponding to three phases (U phase/V phase/W phase).

The isolated gate drivers 1H(u/v/w), while isolating between the ECU 2 and the high-side switches SWH(u/v/w) respectively, generate high-side gate drive signals (corresponding to the output pulse signal OUT mentioned above) according to the high-side gate control signals (corresponding to the input signal IN mentioned above) fed from the ECU 2, and thereby drive the high-side switches SWH(u/v/w).

The isolated gate drivers 1L(u/v/w), while isolating between the ECU 2 and the low-side switches SWL(u/v/w) respectively, generate low-side gate drive signals according to the low-side gate control signals fed from the ECU 2, and thereby drive the low-side switches SWL(u/v/w).

The high-side switches SWH(u/v/w) are high-side power transistors that constitute half-bridge output stages of three phases (U phase/V phase/W phase) respectively, and are externally connected to the switch connection terminals T1 of the corresponding isolated gate drivers 1H(u/v/w) (i.e., the OUT terminal, CLAMP terminal, PROOUT terminal, GND2 terminal, etc. provided at the second semiconductor chip 420 side in FIG. 10) so that their gates are driven by the isolated gate drivers 1H(u/v/w) respectively. The high-side switches SWH(u/v/w) are connected between the power-system power supply terminal (an application terminal for the first motor driving voltage VD1) and the input terminals of the motor M of the corresponding phases.

The low-side switches SWL(u/v/w) are low-side power transistors that constitute half-bridge output stages of three phases (U phase/V phase/W phase) respectively, and are externally connected to the switch connection terminals T1 of the corresponding isolated gate drivers 1L(u/v/w) (i.e., the OUT terminal, CLAMP terminal, PROOUT terminal, GND2 terminal, etc. provided at the second semiconductor chip 420 side in FIG. 10) so that their gates are driven by the isolated gate drivers 1L(u/v/w) respectively. The low-side switches SWL(u/v/w) are connected between the input terminals of the motor M of the corresponding phases and the power-system ground terminal (an application terminal for the second motor driving voltage VD2).

While in the diagram the high-side and low-side switches SWH(u/v/w) and SWL(u/v/w) are implemented with IGBTs, as mentioned earlier they may instead be implemented with SiC-MOSFETs or Si-MOSFETs.

The ECU 2 drives via the isolated gate drivers 1H(u/v/w) and 1L(u/v/w) the high-side and low-side switches SWH(u/v/w) and SWL(u/v/w) respectively, and thereby controls the driving of the rotation of the motor M. The ECU 2 also has a function of monitoring the FLT1 and FLT2 terminals of each of the isolated gate drivers 1H(u/v/w) and 1L(u/v/w) to achieve various kinds of safety control.

Here, the isolated gate driver 1 described previously can be used suitably as any of the isolated gate drivers 1H(u/v/w) and 1L(u/v/w).

In the traction inverter 400 of the first implementation example, the isolated gate drivers 1H(u/v/w) and 1L(u/v/w) each incorporate a non-volatile memory 445 for storing the corresponding adjustment data D1 and D2. This configuration helps reduce the number of components of the traction inverter 400.

Figure 14:
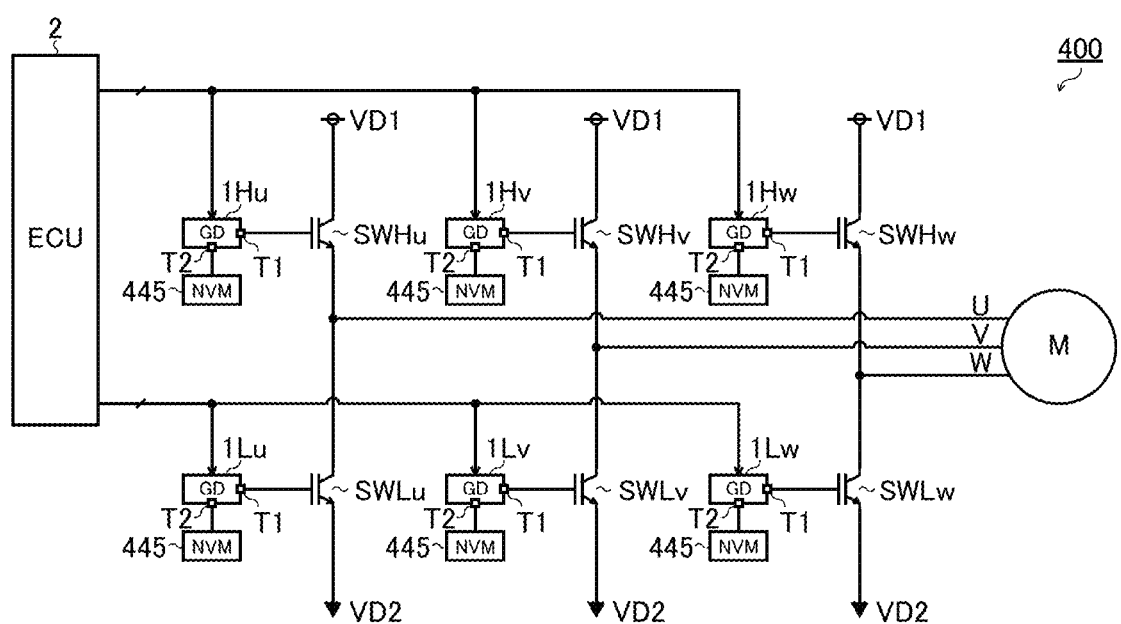
FIG. 14 is a diagram showing a second implementation example of a non-volatile memory.

FIG. 14 is a diagram showing a second implementation example of the non-volatile memory 445. The traction inverter 400 of the second implementation example is based on the first implementation example (FIG. 13), a difference being that the non-volatile memory 445 is externally connected.

In terms of what is shown in the diagram, specifically, in the traction inverter 400 of the second implementation example, to memory connection terminals T2 provided respectively at the secondary side (at the second semiconductor chip 420 side in FIG. 10) of the isolated gate drivers 1H(u/v/w) and 1L(u/v/w), non-volatile memories 445 each having the corresponding adjustment data D1 and D2 written to it are externally connected, on a one-memory-to-one-driver basis. With this configuration, the adjustment data D1 and D2 written to the non-volatile memory 445 on the secondary side can be used to adjust the characteristics of each of the gate driver 441 and the fault detector-controller 442, which are provided on the same, secondary, side. This eliminates the need for signal transmission from the primary side to the secondary side, that is, signal transmission from the first semiconductor chip 410 to the second semiconductor chip 420 via the third semiconductor chip 430. This helps simplify the circuit configuration of the isolated gate driver 1.

Figure 15:
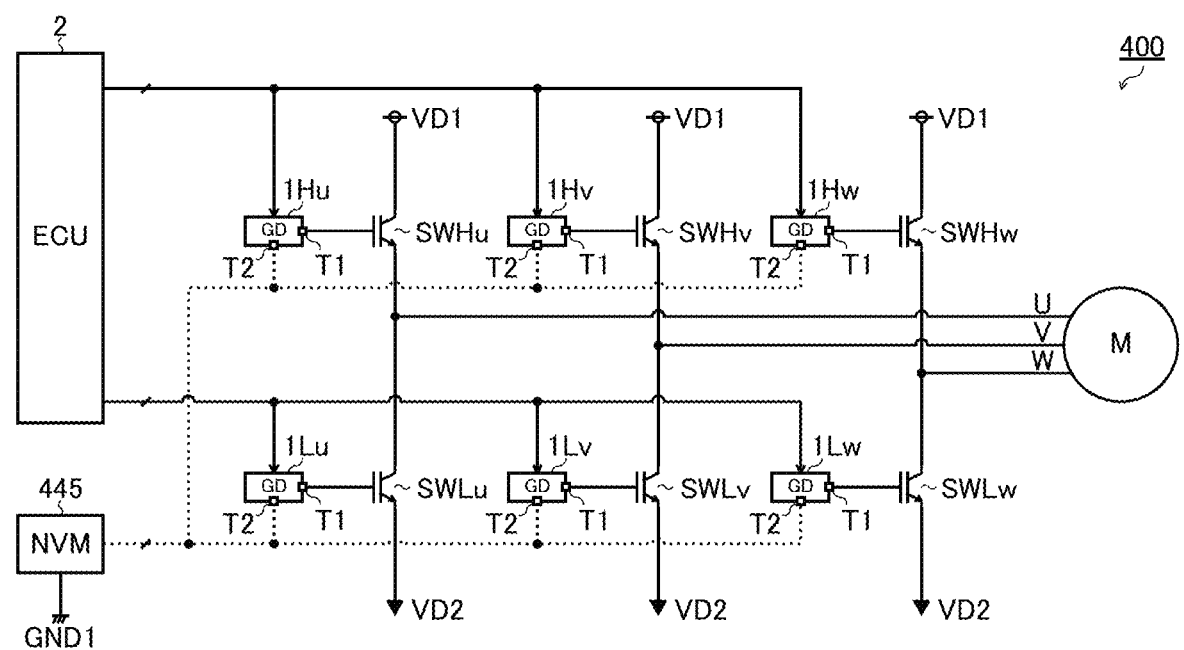
FIG. 15 is a diagram showing a third implementation example of a non-volatile memory.

FIG. 15 is a diagram showing a third implementation example of the non-volatile memory 445. The traction inverter 400 of the third implementation example is based on the first implementation example (FIG. 13), a difference being that the non-volatile memory 445 is externally connected.

In terms of what is shown in the diagram, specifically, in the traction inverter 400 of the third implementation example, to memory connection terminals T2 provided respectively at the primary side (at the first semiconductor chip 410 side in FIG. 10) of the isolated gate drivers 1H(u/v/w) and 1L(u/v/w), a single non-volatile memory 445 having the corresponding adjustment data D1 and D2 written to it is externally connected, on a one-memory-to-all-drivers basis. With this configuration, it is possible to reduce the number of non-volatile memories 445 that are externally connected. It should however be noted that this configuration still requires signal transmission from the primary side to the secondary side, that is, signal transmission from the first semiconductor chip 410 to the second semiconductor chip 420 via the third semiconductor chip 430.

A Study on Deterioration of a Non-Volatile Memory

As the non-volatile memory 445 deteriorates with time, the adjustment data D1 and D2 written to it may be lost. When this occurs, not all of a plurality of bits are lost at once but they are lost bit by bit. To stay prepared for that, it is preferable that the control logic 444 (or non-volatile memory 445) be provided with an error detection-correction circuit ECC that performs error detection and error correction with respect to the adjustment data D1 and D2 written to the non-volatile memory 445.

With the just-mentioned error detection-correction circuit ECC incorporated, if a one-bit error occurs in the adjustment data D1 and D2 written to the non-volatile memory 445, it can be detected and corrected. It is thus possible to properly perform characteristics adjustment for the isolated gate driver 1 and continue the traveling of the electric vehicle without any problem. However, if a two-or-more-bit error occurs in the adjustment data D1 and D2 written to the non-volatile memory 445, the error detection-correction circuit ECC can no longer correct them. This makes it impossible to properly perform characteristics adjustment for the isolated gate driver 1 and continue safe traveling of the electric vehicle.

In view of the above study, it is preferable to switch the fault output from the isolated gate driver 1 according to whether the adjustment data D1 and D2 has a one-bit error or a two-or-more-bit error. Presented below will be examples of operation for appropriate fault output.

Fault Output

FIG. 16 is a table showing a first operation example of fault output, showing the error detection result with respect to the non-volatile memory 445, the enabled/disabled state of the gate driver 441, and the output states at the FLT1 and FLT2 terminals respectively.

Error detection with respect to the non-volatile memory 445 is carried out chiefly by the error detection-correction circuit ECC. Enabled/disabled state switching for the gate driver 441 and fault output via the FLT1 and FLT2 terminals are carried out chiefly by the fault detector-controller 442.

As shown at line 1, when the adjustment data D1 and D2 written to the non-volatile memory 445 is normal, the gate driver 441 performs normal operation. In this case, the FLT1 and FLT2 terminals are both in a high-impedance state, and thus the external fault signals FLT1 and FLT2 delivered to the ECU 2 are, by being pulled-up by the resistors R1 and R2, at high level (i.e., the logic level indicating normal condition).

As shown at line 2, if a one-bit error is detected in the adjustment data D1 and D2 written to the non-volatile memory 445, the FLT2 terminal is kept at low level (the logic level indicating an error being detected) and the gate driver 441 continues normal operation. The FLT1 terminal remains in a high-impedance state. In this way, a one-bit error can be detected and corrected by the error detection-correction circuit ECC, and thus the normal operation of the gate driver 441, and hence the traveling of the electric vehicle, can be continued with no problem.

Even if a one-bit error is detected in the adjustment data D1 and D2, characteristics adjustment for the isolated gate driver 1 can be performed properly; thus fault output for the ECU 2 (i.e., output of a low-level external fault signal FLT2) does not necessarily have to be performed. Even so, by performing such fault output in anticipation of an upcoming error in another bit, it is possible to previously notify the electric vehicle's driver of the likelihood of a breakdown. It is thus possible to prevent the electric vehicle from breaking down suddenly, with no previous sign, on occurrence of a two-bit error.

As shown at line 3, if a two-or-more-bit error is detected in the adjustment data D1 and D2 written to the non-volatile memory 445, the FLT1 and FLT2 terminals are both kept at low level and the gate driver 441 is forcibly stopped. In this way, if a two-or-more-bit error occurs, it is impossible to correct the adjustment data D1 and D2 and thus to perform characteristics adjustment for the isolated gate driver 1 properly. It is therefore of the highest priority to forcibly stop the gate driver 441 to ensure the safety of the electric vehicle.

Moreover, by dropping the external fault signal FLT1 to low level, it is possible to promptly notify the ECU 2 of the occurrence of some serious fault in the isolated gate driver 1 or the high-side switch SWH (here, a two-or-more-bit error in the non-volatile memory 445 and the resulting forcible stop of the gate driver 441).

FIG. 17 is a table showing a second operation example of fault output and, like FIG. 16 referred to previously, shows the error detection result with respect to the non-volatile memory 445, the enabled/disabled state of the gate driver 441, and the output states at the FLT1 and FLT2 terminals respectively.

The second operation example shown in the diagram is basically similar to the first operation example (FIG. 16) described previously, the only difference being that, if a two-or-more-bit error is detected in the adjustment data D1 and D2 written to the non-volatile memory 445, the FLT2 terminal is kept in a high-impedance state. In this way, on detection of a two-or-more-bit error, the FLT1 terminal is used to perform fault output for the ECU 2; thus, the output state at the FLT2 terminal does not matter.

FIG. 18 is a table showing a third operation example of fault output, and shows the error detection result with respect to the non-volatile memory 445, the fault detection result with respect to other than the non-volatile memory 445 (such as UVLO, OVP, SCP, and OTP), the enabled/disabled state of the gate driver 441, and the output states at the FLT1 and FLT2 terminals respectively.

Error detection with respect to the non-volatile memory 445 is carried out chiefly by the error detection-correction circuit ECC. On the other hand, fault detection with respect to other than the non-volatile memory 445 (such as UVLO, OVP, SCP, and OTP), enabled/disabled state switching for the gate driver 441, and fault output via the FLT1 and FLT2 terminals are carried out chiefly by the fault detector-controller 442.

As shown at line 1, if the adjustment data D1 and D2 written to the non-volatile memory 445 is normal and in addition no fault is detected with respect to other than the non-volatile memory 445, the gate driver 441 performs normal operation. In this case, the FLT1 and FLT2 terminals are both in a high-impedance state, and thus the external fault signals FLT1 and FLT2 delivered to the ECU 2 are, by being pulled-up by the resistors R1 and R2, at high level (the logic level indicating normal condition).

As shown at line 2, if the adjustment data D1 and D2 written to the non-volatile memory 445 is normal but a fault is detected with respect to other than the non-volatile memory 445, then, regardless of the error detection result, the FLT1 terminal is kept at low level (the output state indicating a fault being detected) and the gate driver 441 is forcibly stopped. It is thus possible, while ensuring the safety of the electric vehicle, to promptly notify the ECU 2 of the occurrence of some serious fault (such as UVLO, OVP, SCP, or OTP) in the isolated gate driver 1 or the high-side switch SWH. Since the adjustment data D1 and D2 has no error, the FLT2 terminal remains in a high-impedance state.

As shown at line 3, if a one-bit error is detected in the adjustment data D1 and D2 written to the non-volatile memory 445 and in addition no fault is detected elsewhere than in the non-volatile memory 445, the FLT2 terminal is kept at low level (the logic level indicating an error being detected) and the gate driver 441 continues normal operation. The FLT1 terminal remains in a high-impedance state. In this way, a one-bit error can be detected and corrected by the error detection-correction circuit ECC, and thus the normal operation of the gate driver 441, and hence the traveling of the electric vehicle, can be continued with no problem. Moreover, with the FLT2 terminal dropped to low level, it is possible to notify the electric vehicle's driver of a sign of a breakdown.

As shown at line 4, if a one-bit error is detected in the adjustment data D1 and D2 written to the non-volatile memory 445 and in addition also a fault is detected elsewhere than in the non-volatile memory 445, the FLT1 and FLT2 terminals are both kept at low level and the gate driver 441 is forcibly stopped. In this way, if a fault is detected elsewhere than in the non-volatile memory 445, as in the case shown at line 1 and described previously, regardless of the error detection result, the FLT1 terminal is kept at low level (the output state indicating a fault being detected), the gate driver 441 is forcibly stopped. It is thus possible, while ensuring the safety of the electric vehicle, to promptly notify the ECU 2 of the occurrence of some serious fault (such as UVLO, OVP, SCP, or OTP) in the isolated gate driver 1 or the high-side switches SWH.

As shown at line 5, if a two-or-more-bit error is detected in the adjustment data D1 and D2 written to the non-volatile memory 445, then, regardless of the fault detection result with respect to other than the non-volatile memory 445, the FLT1 and FLT2 terminals are both kept at low level and the gate driver 441 is forcibly stopped. In this way, if a two-or-more-bit error occurs, it is impossible to correct the adjustment data D1 and D2 and thus to perform characteristics adjustment for the isolated gate driver 1 properly. It is therefore of the highest priority to forcibly stop the gate driver 441 to ensure the safety of the electric vehicle.

Moreover, by dropping the external fault signal FLT1 to low level, it is possible to promptly indicate the ECU 2 of the occurrence of some serious fault in the isolated gate driver 1 or the high-side switch SWH (here, a two-or-more-bit error in the non-volatile memory 445 and the resulting forcible stop of the gate driver 441). In these respects, this operation example is no different from the first and second operation examples (FIGS. 16 and 17 respectively) described previously.

FIG. 19 is a table showing a fourth operation example of fault output and, like FIG. 18 referred to previously, shows the error detection result with respect to the non-volatile memory 445, the fault detection result with respect to other than the non-volatile memory 445 (such as UVLO, OVP, SCP, and OTP), the enabled/disabled state of the gate driver 441, and the output states at the FLT1 and FLT2 terminals respectively.

The fourth operation example shown in the diagram is basically similar to the third operation example (FIG. 18) described previously, the only difference being that, if a two-or-more-bit error is detected in the adjustment data D1 and D2 written to the non-volatile memory 445, the FLT2 terminal is kept in a high-impedance state. In this way, on detection of a two-or-more-bit error, the FLT1 terminal is used to perform fault output for the ECU 2; thus, the output state at the FLT2 terminal does not matter.

Sharing of a Fault Signal Output Terminal

In the first to fourth operation examples (FIGS. 16 to 19) described previously, if with respect to the adjustment data D1 and D2 written to the non-volatile memory 445 a one-bit error is detected, the FLT2 terminal is used to perform fault output (sign-of-breakdown notification) and, if a two-or-more-bit error is detected, the FLT1 terminal is used to perform fault output (breakdown notification). Here, these two kinds of fault output can be performed via the FLT2 terminal alone, while the FLT1 terminal is left uninvolved. Now, with reference to the relevant diagrams, a description will be given of examples in which the FLT2 terminal is shared.

Figure 20:
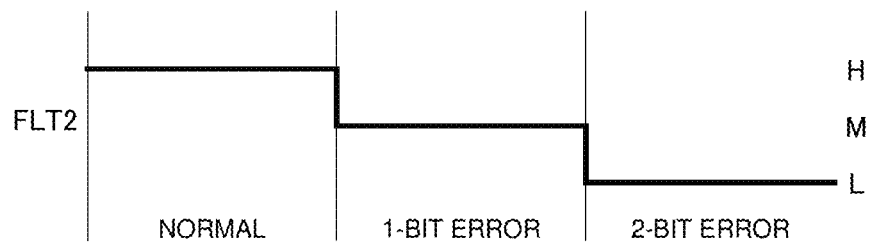
FIG. 20 is a diagram showing a first example of sharing a fault signal output terminal.

FIG. 20 is a diagram showing a first example of sharing a fault signal output terminal (here, the FLT2 terminal). As shown there, the fault detector-controller 442 can, if the adjustment data D1 and D2 is normal, keep the FLT2 terminal at high level (e.g., VCC1); if a one-bit error is detected in the adjustment data D1 and D2, keep the FLT2 terminal at middle level (e.g., VCC1/2); and if a two-or-more-bit error is detected in the adjustment data D1 and D2, keep the FLT2 terminal at low level (e.g., GND1). With this configuration, it is possible to recognize the result of error detection based on the voltage level at the FLT2 terminal.

Figure 21:
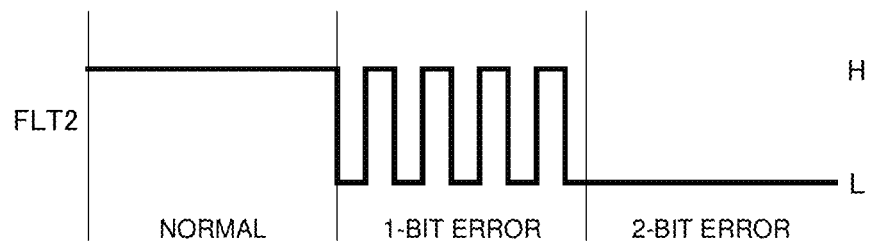
FIG. 21 is a diagram showing a second example of sharing a fault signal output terminal.

FIG. 21 is a diagram showing a second example of sharing a fault signal output terminal (here, the FLT2 terminal). As shown there, the fault detector-controller 442 can, if the adjustment data D1 and D2 is normal, hold the FLT2 terminal at high level; if a one-bit error is detected in the adjustment data D1 and D2, pulse-drive (oscillate) the FLT2 terminal between high and low levels; and if a two-or-more-bit error is detected in the adjustment data D1 and D2, hold the FLT2 terminal at low level. With this configuration, it is possible to recognize the result of error detection based on the logic level at the FLT2 terminal and whether it is oscillated.

Figure 22:
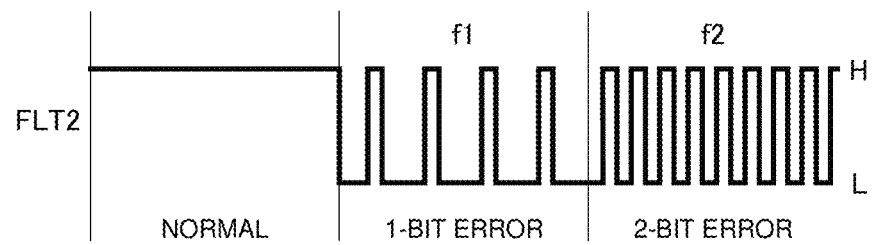
FIG. 22 is a diagram showing a third example of sharing a fault signal output terminal.

FIG. 22 is a diagram showing a third example of sharing a fault signal output terminal (here, the FLT2 terminal). As shown there, the fault detector-controller 442 can, if the adjustment data D1 and D2 is normal, hold the FLT2 terminal at high level; if a one-bit error is detected in the adjustment data D1 and D2, pulse-drive (oscillate) the FLT2 terminal at a pulse frequency f1; and if a two-or-more-bit error is detected in the adjustment data D1 and D2, pulse-drive the FLT2 terminal at a pulse frequency f2 (e.g., f2>f1).

With this configuration, it is possible to recognize the result of error detection based on the logic level and the pulse frequency at the FLT2 terminal.

While no more illustration will be given, a fault signal output terminal can be shared in any manner other than as described above, by changing the output state at the FLT2 terminal as desired according to the result of error detection with respect to the adjustment data D1 and D2. For example, a parameter (such as pulse width, duty, or type of modulation) with which the FLT2 terminal is pulse-driven can be changed.

Application to Electric Vehicles

Figure 23:
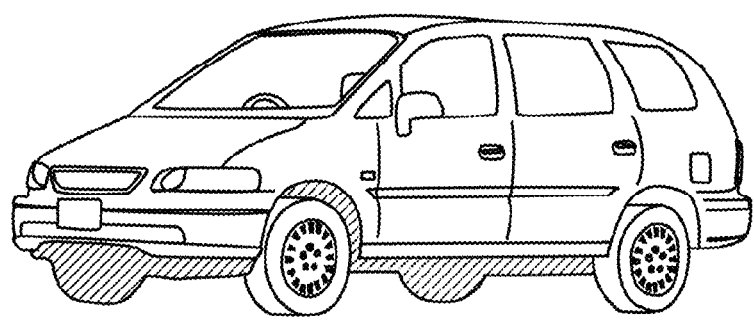
FIG. 23 is a diagram showing the exterior appearance of an electric vehicle.

FIG. 23 is a diagram showing the exterior appearance of an electric vehicle. As has been described above, the isolated gate driver 1 described previously and the traction inverter 400 employing it can be used suitably as a means for driving a motor on an electric vehicle X10.

Overview

To follow is an overview of the various embodiments described above.

For example, according to what is disclosed herein, an isolated gate driver includes: a switch connection terminal configured to have a switching element externally connected to it; a non-volatile memory having adjustment data written to it; a register configured to store the adjustment data read from the non-volatile memory; a gate driving circuit configured to drive the gate of the switching element with a characteristic set based on a value stored in the register; and a control logic circuit configured to keep the gate driving circuit in a disabled state until completion of reading the adjustment data from the non-volatile memory and storing the adjustment data in the register. (A first configuration.)

For another example, according to what is disclosed herein, an isolated gate driver includes: a switch connection terminal configured to have a switching element externally connected to it; a memory connection terminal configured to have externally connected to it a non-volatile memory having adjustment data written to it; a register configured to store the adjustment data read from the non-volatile memory; a gate driving circuit configured to drive the gate of the switching element with a characteristic set based on a value stored in the register; and a control logic circuit configured to keep the gate driving circuit in a disabled state until completion of reading the adjustment data from the non-volatile memory and storing the adjustment data in the register. (A second configuration.)

The isolated gate driver of the first or second configuration described above may further include: a fault detector configured to detect a fault with the characteristic set based on the value stored in the register. (A third configuration.)

In the isolated gate driver of any of the first to third configurations described above, the control logic circuit may be configured to start reading the adjustment data from the non-volatile memory after, as the supply voltage fed to the isolated gate driver rises, UVLO is canceled; continues storing the adjustment data in the register while keeping the gate driving circuit in the disabled state until completion of storing the adjustment data in the register; and cancel the disabled state of the gate driving circuit on completion of storing the adjustment data in the register. (A fourth configuration.)

In the isolated gate driver of any of the first, third, and fourth configurations described above, the following may be sealed in a single package: a first semiconductor chip having the circuit elements of a primary circuit system integrated in it; a second semiconductor chip having the circuit elements of a secondary circuit system integrated in it; and a third semiconductor chip having integrated in it an insulating element for transmitting a signal between, while isolating between, the first and second semiconductor chips. (A fifth configuration.)

In the isolated gate driver of the second configuration described above, the following may be sealed in a single package: a first semiconductor chip having the circuit elements of a primary circuit system integrated in it; a second semiconductor chip having the circuit elements of a secondary circuit system integrated in it; and a third semiconductor chip having integrated in it an insulating element for transmitting a signal between, while isolating between, the first and second semiconductor chips. (A sixth configuration.)

In the isolated gate driver of the fifth or sixth configuration described above, the register and the gate driving circuit may both be integrated in the second semiconductor chip. (A seventh configuration.)

For another example, according to what is disclosed herein, a traction inverter includes: the isolated gate driver of the first configuration described above; and the switching element externally connected to the switch connection terminal of the isolated gate driver, the switching element being configured to have its gate driven by the isolated gate driver. (An eighth configuration.)

For another example, according to what is disclosed herein, a traction inverter includes: the isolated gate driver of the second configuration described above; the switching element externally connected to the switch connection terminal of the isolated gate driver, the switching element being configured to have its gate driven by the isolated gate driver; and the non-volatile memory externally connected to the memory connection terminal of the isolated gate driver, the non-volatile memory being configured to store the adjustment data for the isolated gate driver. (A ninth configuration.)

For another example, according to what is disclosed herein, a traction inverter includes: a plurality of the isolated gate drivers of the sixth configuration described above; a plurality of the switching elements externally connected to a plurality of the switch connection terminals provided at the second-semiconductor-chip side of the plurality of the isolated gate drivers respectively, the plurality of the switching elements being configured to have their gates driven by the plurality of the isolated gate drivers respectively; and a plurality of the non-volatile memories externally connected to a plurality of the memory connection terminals provided at the second-semiconductor-chip side of the plurality of the isolated gate drivers respectively, the plurality of the non-volatile memories being configured to store the adjustment data for the plurality of the isolated gate drivers respectively. (A tenth configuration.)

For another example, according to what is disclosed herein, a traction inverter includes: a plurality of the isolated gate drivers of the sixth configuration described above; a plurality of the switching elements externally connected to a plurality of the switch connection terminals provided at the second-semiconductor-chip side of the plurality of the isolated gate drivers respectively, the plurality of the switching elements being configured to have their gates driven by the plurality of the isolated gate drivers respectively; and a single non-volatile memory as the non-volatile memory externally connected to all of a plurality of the memory connection terminals provided at the first-semiconductorchip side of the plurality of the isolated gate drivers, the non-volatile memory being configured to store the adjustment data for all of the plurality of the isolated gate drivers. (An eleventh configuration.)

For another example, according to what is disclosed herein, an electric vehicle includes: the traction inverter of any of the eighth to eleventh configurations described above. (A twelfth configuration.)

For another example, according to what is disclosed herein, an isolated gate driver includes: a switch connection terminal configured to have a switching element externally connected to it; a non-volatile memory having adjustment data written to it; a register configured to store the adjustment data read from the non-volatile memory; a gate driving circuit configured to drive the gate of the switching element with a characteristic set based on a value stored in the register; a fault detector configured to perform fault detection with respect to other than the non-volatile memory; an error detection-correction circuit configured to perform error detection and error correction with respect to the adjustment data written to the non-volatile memory; a first external terminal configured to externally output the result of the fault detection; a second external terminal configured to externally output the result of the error detection; and a fault controller configured to, if a one-bit error is detected in the adjustment data, bring the second external terminal into an error-indicating output state and continue with normal operation of the gate driving circuit and, if a two-or-more-bit error is detected, forcibly stop the gate driving circuit. (A thirteenth configuration.)

For another example, according to what is disclosed herein, an isolated gate driver includes: a switch connection terminal configured to have a switching element externally connected to it; a memory connection terminal configured to have externally connected to it a non-volatile memory having adjustment data written to it; a register configured to store the adjustment data read from the non-volatile memory; a gate driving circuit configured to drive the gate of the switching element with a characteristic set based on a value stored in the register; a fault detector configured to perform fault detection with respect to other than the non-volatile memory; an error detection-correction circuit configured to perform error detection and error correction with respect to the adjustment data written to the non-volatile memory; a first external terminal configured to externally output the result of the fault detection; a second external terminal configured to externally output the result of the error detection; and a fault controller configured to, if a one-bit error is detected in the adjustment data, bring the second external terminal into an error-indicating output state and continue with normal operation of the gate driving circuit and, if a two-or-more-bit error is detected, forcibly stop the gate driving circuit. (A fourteenth configuration.)

In the isolated gate driver of the thirteenth or fourteenth configuration described above, the fault controller may be configured to, if a two-or-more-bit error is detected in the adjustment data, bring the first external terminal into a fault-indicating output state regardless of the result of the fault detection. (A fifteenth configuration.)

In the isolated gate driver of any of the thirteenth to fifteenth configurations described above, the fault controller may be configured to, if a fault is detected with respect to other than the non-volatile memory, bring the first external terminal into a fault-indicating output state regardless of the result of the error detection and forcibly stop the gate driving circuit. (A sixteenth configuration.)

Or, in the isolated gate driver of the thirteenth or fourteenth configuration described above, the fault controller may be configured to, if a one-bit error is detected in the adjustment data, bring the second external terminal into a first output state and, if a two-or-more-bit error is detected in the adjustment data, bring the second external terminal into a second output state different from the first output state. (A seventeenth configuration.)

In the isolated gate driver of any of the thirteenth and fifteenth to seventeenth configurations described above, the following may be sealed in a single package: a first semiconductor chip having circuit elements of a primary circuit system integrated in it; a second semiconductor chip having circuit elements of a secondary circuit system integrated in it; and a third semiconductor chip having integrated in it an insulating element for transmitting a signal between, while isolating between, the first and second semiconductor chips. (A eighteenth configuration.)

In the isolated gate driver of the fourteenth configuration described above, the following may be sealed in a single package: a first semiconductor chip having circuit elements of a primary circuit system integrated in it; a second semiconductor chip having circuit elements of a secondary circuit system integrated in it; and a third semiconductor chip having integrated in it an insulating element for transmitting a signal between, while isolating between, the first and second semiconductor chips. (A nineteenth configuration.)

In the isolated gate driver of the eighteenth to nineteenth configuration described above, the register and the gate driving circuit may both be integrated in the second semiconductor chip. (A twentieth configuration.)

For another example, according to what is disclosed herein, a traction inverter includes: the isolated gate driver of the thirteenth configuration described above; and the switching element externally connected to the switch connection terminal of the isolated gate driver, the switching element being configured to have its gate driven by the isolated gate driver. (A twenty-first configuration.)

For another example, according to what is disclosed herein, a traction inverter includes: the isolated gate driver of the fourteenth configuration described above; the switching element externally connected to the switch connection terminal of the isolated gate driver, the switching element being configured to have its gate driven by the isolated gate driver; and the non-volatile memory externally connected to the memory connection terminal of the isolated gate driver, the non-volatile memory being configured to store the adjustment data for the isolated gate driver. (A twenty-second configuration.)

For another example, according to what is disclosed herein, a traction inverter includes: a plurality of the isolated gate drivers of the nineteenth configuration described above; a plurality of the switching elements externally connected to a plurality of the switch connection terminals provided at the second-semiconductor-chip side of the plurality of the isolated gate drivers respectively, the plurality of the switching elements being configured to have their gates driven by the plurality of the isolated gate drivers respectively; and a plurality of the non-volatile memories externally connected to a plurality of the memory connection terminals provided at the second-semiconductor-chip side of the plurality of the isolated gate drivers respectively, the plurality of the non-volatile memories being configured to store the adjustment data for the plurality of the isolated gate drivers respectively. (A twenty-third configuration.)

For another example, according to what is disclosed herein, a traction inverter includes: a plurality of the isolated gate drivers of the nineteenth configuration described above; a plurality of the switching elements externally connected to a plurality of the switch connection terminals provided at the second-semiconductor-chip side of the plurality of the isolated gate drivers respectively, the plurality of the switching elements being configured to have their gates driven by the plurality of the isolated gate drivers respectively; and a single non-volatile memory as the non-volatile memory externally connected to all of a plurality of the memory connection terminals provided at the first-semiconductor-chip side of the plurality of the isolated gate drivers, the non-volatile memory being configured to store the adjustment data for all of the plurality of the isolated gate drivers. (A twenty-fourth configuration.)

For another example, according to what is disclosed herein, an electric vehicle includes: the traction inverter of any of the twenty-first to twenty-fourth configurations described above. (A twenty-fifth configuration.)

According to the invention disclosed herein, it is possible to provide an isolated gate driver that contributes to size reduction and cost reduction of sets, and to provide traction inverters and electric vehicles that employ such isolated gate drivers.

Further Modifications

The embodiments described above deal with examples where an isolated gate driver is applied to a traction inverter incorporated in an electric vehicle. This however is not meant to limit the application of isolated gate drivers, which find wide applications in industrial equipment, medical equipment, and the like.

What is disclosed herein as to the implementation of a non-volatile memory and as to novel start-up sequences and fault output in that connection can be applied not only to isolated gate drivers but to signal transmission devices in general, regardless of whether they are of an insulated or non-insulated type.

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope equivalent in significance to what is claimed.

The invention claimed is:

1. An isolated gate driver, comprising:
a switch connection terminal configured to have a switching element externally connected thereto;
a non-volatile memory having adjustment data written thereto;
a register configured to store the adjustment data read from the non-volatile memory;
a gate driving circuit configured to drive a gate of the switching element with a characteristic set based on a value stored in the register; and
a control logic circuit configured to keep the gate driving circuit in a disabled state until completion of reading the adjustment data from the non-volatile memory and storing the adjustment data in the register.

2. The isolated gate driver according to claim 1, further comprising:

a fault detector configured to detect a fault with the characteristic set based on the value stored in the register.

3. The isolated gate driver according to claim 1, wherein the control logic circuit is configured to
start reading the adjustment data from the non-volatile memory after, as a supply voltage fed to the isolated gate driver rises, UVLO is canceled,
continues storing the adjustment data in the register while keeping the gate driving circuit in the disabled state until completion of storing the adjustment data in the register, and
cancel the disabled state of the gate driving circuit on completion of storing the adjustment data in the register.

4. The isolated gate driver according to claim 1, wherein
a first semiconductor chip having circuit elements of a primary circuit system integrated therein,
a second semiconductor chip having circuit elements of a secondary circuit system integrated therein, and
a third semiconductor chip having integrated therein an insulating element for transmitting a signal between, while isolating between, the first and second semiconductor chips
are sealed in a single package.

5. The isolated gate driver according to claim 4, wherein the register and the gate driving circuit are both integrated in the second semiconductor chip.

6. A traction inverter, comprising:
the isolated gate driver according to claim 1; and
the switching element externally connected to the switch connection terminal of the isolated gate driver, the switching element being configured to have a gate thereof driven by the isolated gate driver.

7. An electric vehicle, comprising:
the traction inverter according to claim 6.

8. An isolated gate driver, comprising:
a switch connection terminal configured to have a switching element externally connected thereto;
a memory connection terminal configured to have externally connected thereto a non-volatile memory having adjustment data written thereto;
a register configured to store the adjustment data read from the non-volatile memory;
a gate driving circuit configured to drive a gate of the switching element with a characteristic set based on a value stored in the register; and
a control logic circuit configured to keep the gate driving circuit in a disabled state until completion of reading the adjustment data from the non-volatile memory and storing the adjustment data in the register.

9. The isolated gate driver according to claim 8, wherein
a first semiconductor chip having circuit elements of a primary circuit system integrated therein,
a second semiconductor chip having circuit elements of a secondary circuit system integrated therein, and
a third semiconductor chip having integrated therein an insulating element for transmitting a signal between, while isolating between, the first and second semiconductor chips
are sealed in a single package.

10. A traction inverter, comprising:
the isolated gate driver according to claim 8;
the switching element externally connected to the switch connection terminal of the isolated gate driver, the switching element being configured to have a gate thereof driven by the isolated gate driver; and the non-volatile memory externally connected to the memory connection terminal of the isolated gate driver, the non-volatile memory being configured to store the adjustment data for the isolated gate driver.

11. A traction inverter, comprising:

a plurality of the isolated gate drivers according to claim 9;

a plurality of the switching elements externally connected to a plurality of the switch connection terminals provided at a second-semiconductor-chip side of the plurality of the isolated gate drivers respectively, the plurality of the switching elements being configured to have gates thereof driven by the plurality of the isolated gate drivers respectively; and a plurality of the non-volatile memories externally connected to a plurality of the memory connection terminals provided at the second-semiconductor-chip side of the plurality of the isolated gate drivers respectively, the plurality of the non-volatile memories being configured to store the adjustment data for the plurality of the isolated gate drivers respectively.

12. A traction inverter, comprising:

a plurality of the isolated gate drivers according to claim 9;

a plurality of the switching elements externally connected to a plurality of the switch connection terminals provided at a second-semiconductor-chip side of the plurality of the isolated gate drivers respectively, the plurality of the switching elements being configured to have gates thereof driven by the plurality of the isolated gate drivers respectively; and a single non-volatile memory as the non-volatile memory externally connected to all of a plurality of the memory connection terminals provided at a first-semiconductor-chip side of the plurality of the isolated gate drivers, the non-volatile memory being configured to store the adjustment data for all of the plurality of the isolated gate drivers.

* * * * *